United States Patent
Iijima et al.

(10) Patent No.: US 12,433,087 B2
(45) Date of Patent: Sep. 30, 2025

(54) IMAGING DEVICE

(71) Applicant: Panasonic Intellectual Property Management Co., Ltd., Osaka (JP)

(72) Inventors: Hiroaki Iijima, Nara (JP); Yuko Kishimoto, Osaka (JP); Masaya Hirade, Osaka (JP); Shinji Tanaka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 449 days.

(21) Appl. No.: 17/938,682

(22) Filed: Oct. 7, 2022

(65) Prior Publication Data

US 2023/0045630 A1 Feb. 9, 2023

Related U.S. Application Data

(63) Continuation of application No. PCT/JP2021/015520, filed on Apr. 15, 2021.

(30) Foreign Application Priority Data

Apr. 27, 2020 (JP) .................................. 2020-078446

(51) Int. Cl.
*H10K 39/32* (2023.01)
*H04N 23/73* (2023.01)
(Continued)

(52) U.S. Cl.
CPC ............. *H10K 39/32* (2023.02); *H04N 23/73* (2023.01); *H04N 25/62* (2023.01); *H10K 30/353* (2023.02)

(58) Field of Classification Search
CPC ...... H10K 39/32; H10K 30/353; H10K 30/30; H10K 2101/40; H04N 23/73; H04N 25/62;
(Continued)

(56) References Cited

U.S. PATENT DOCUMENTS

2008/0035965 A1* 2/2008 Hayashi ............. C09B 57/008
257/440
2012/0098079 A1* 4/2012 Suzuki ................. B82Y 10/00
977/734
(Continued)

FOREIGN PATENT DOCUMENTS

JP 2014-022525 2/2014
JP 2018-092990 6/2018
(Continued)

OTHER PUBLICATIONS

International Search Report of PCT application No. PCT/JP2021/015520 dated Jun. 29, 2021.

*Primary Examiner* — Samuel Park
(74) *Attorney, Agent, or Firm* — Rimon P.C.

(57) ABSTRACT

An imaging device includes pixels. Each of the pixels includes a first electrode, a second electrode, a photoelectric conversion layer that is located between the first electrode and the second electrode, that contains a donor semiconductor material and an acceptor semiconductor material, and that generates a pair of an electron and a hole, a first charge blocking layer located between the first electrode and the photoelectric conversion layer, a second charge blocking layer located between the second electrode and the photoelectric conversion layer, and a charge storage region that is electrically connected to the second electrode and that stores the hole. The difference between the electron affinity of the acceptor semiconductor material and the electron affinity of the first charge blocking layer is larger than the difference between the ionization potential of the donor semiconductor material and the ionization potential of the second charge blocking layer.

17 Claims, 10 Drawing Sheets

(51) Int. Cl.
*H04N 25/62* (2023.01)
*H10K 30/30* (2023.01)

(58) Field of Classification Search
CPC ... H10F 39/191; H10F 39/8033; Y02E 10/549
See application file for complete search history.

(56) References Cited

U.S. PATENT DOCUMENTS

| | | |
|---|---|---|
| 2018/0151608 A1 | 5/2018 | Tashiro |
| 2018/0227510 A1 | 8/2018 | Machida et al. |
| 2018/0227524 A1 | 8/2018 | Machida et al. |
| 2018/0294316 A1 | 10/2018 | Tokuhara et al. |
| 2018/0315798 A1* | 11/2018 | Shimasaki ............. H10K 39/32 |
| 2018/0338099 A1 | 11/2018 | Tashiro |

FOREIGN PATENT DOCUMENTS

| | | |
|---|---|---|
| JP | 2018-125848 A | 8/2018 |
| JP | 2018-125850 A | 8/2018 |
| JP | 2018-182314 | 11/2018 |
| JP | 2018-195977 A | 12/2018 |

\* cited by examiner

IMAGING DEVICE

BACKGROUND

1. Technical Field

The present disclosure relates to an imaging device using photoelectric conversion elements.

2. Description of the Related Art

A photoelectric conversion element that uses a semiconductor material thin film generates charges under light and can be used as a photosensor by extracting the charges as an electric signal. In this case, to prevent backflow of charges from an electrode, Japanese Patent No. 5969843, for example, discloses a method in which an electron blocking layer or a hole blocking layer is disposed between the photoelectric conversion material and the electrode. Japanese Unexamined Patent Application Publication No. 2018-092990 discloses a method in which a bias voltage applied to electrodes connected to opposite ends of a photoelectric conversion element is changed.

SUMMARY

In one general aspect, the techniques disclosed here feature an imaging device including a plurality of pixels. Each of the plurality of pixels includes a first electrode, a second electrode, a photoelectric conversion layer that is located between the first electrode and the second electrode, that contains a donor semiconductor material and an acceptor semiconductor material, and that generates a pair of an electron and a hole, a first charge blocking layer located between the first electrode and the photoelectric conversion layer, a second charge blocking layer located between the second electrode and the photoelectric conversion layer, and a charge storage region that is electrically connected to the second electrode and that stores the hole as a signal charge. The ionization potential of the second charge blocking layer is equal to or larger than the ionization potential of the donor semiconductor material. The electron affinity of the first charge blocking layer is smaller than the electron affinity of the acceptor semiconductor material. The difference between the electron affinity of the acceptor semiconductor material and the electron affinity of the first charge blocking layer is larger than the difference between the ionization potential of the donor semiconductor material and the ionization potential of the second charge blocking layer.

In another general aspect, the techniques disclosed here feature an imaging device including a plurality of pixels. Each of the plurality of pixels includes a first electrode, a second electrode, a photoelectric conversion layer that is located between the first electrode and the second electrode, that contains a donor semiconductor material and an acceptor semiconductor material, and that generates a pair of an electron and a hole, a first charge blocking layer located between the first electrode and the photoelectric conversion layer, a second charge blocking layer located between the second electrode and the photoelectric conversion layer, and a charge storage region that is electrically connected to the second electrode and that stores the electron as a signal charge. The electron affinity of the second charge blocking layer is equal to or smaller than the electron affinity of the acceptor semiconductor material. The ionization potential of the first charge blocking layer is larger than the ionization potential of the donor semiconductor material. The difference between the ionization potential of the donor semiconductor material and the ionization potential of the first charge blocking layer is larger than the difference between the electron affinity of the acceptor semiconductor material and the electron affinity of the second charge blocking layer.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
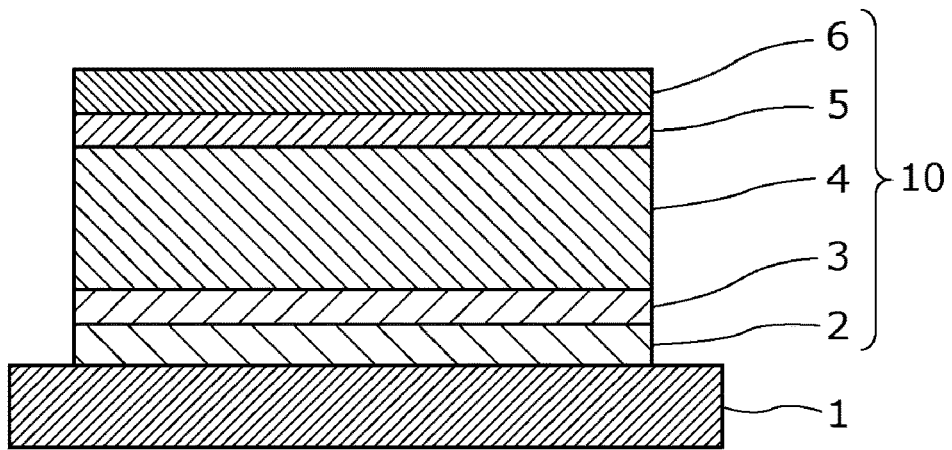
FIG. 1 is a schematic cross-sectional view showing the structure of a photoelectric conversion element in an embodiment.

To improve the S/N (signal-to-noise) ratio of an imaging device, it is desirable to reduce its parasitic sensitivity.

Overview of the Present Disclosure

Aspects of the present disclosure are as follows.

An imaging device according to one aspect of the present disclosure includes a plurality of pixels. Each of the plurality of pixels includes a first electrode, a second electrode, a photoelectric conversion layer that is located between the first electrode and the second electrode, that contains a donor semiconductor material and an acceptor semiconductor material, and that generates a pair of an electron and a hole, a first charge blocking layer located between the first electrode and the photoelectric conversion layer, a second charge blocking layer located between the second electrode and the photoelectric conversion layer, and a charge storage region that is electrically connected to the second electrode and that stores the hole as a signal charge. The ionization potential of the second charge blocking layer is equal to or larger than the ionization potential of the donor semiconductor material. The electron affinity of the first charge blocking layer is smaller than the electron affinity of the acceptor semiconductor material. The difference between the electron affinity of the acceptor semiconductor material and the electron affinity of the first charge blocking layer is larger than the difference between the ionization potential of the donor semiconductor material and the ionization potential of the second charge blocking layer.

When these relations among the electron affinities and the ionization potentials hold, the energy barrier when the electrons generated in the photoelectric conversion layer migrate to the first electrode is larger than the energy barrier when the holes generated in the photoelectric conversion layer migrate to the second electrode. Therefore, the electrons are more likely to remain in the photoelectric conversion layer than the holes. In this case, when the holes stored in the charge storage region are read as signal charges, the electrons that are more likely to remain in the photoelectric conversion layer recombine with holes remaining in the photoelectric conversion layer at the timing at which the migration of holes to the charge storage region is to be stopped, so that the recombination of holes is facilitated sufficiently. In this manner, migration of holes to the charge storage region is prevented irrespective of the amount of light applied to the photoelectric conversion layer. Therefore, the parasitic sensitivity of the imaging device can be reduced.

For example, the difference between the electron affinity of the acceptor semiconductor material and the electron affinity of the first charge blocking layer may be larger by at least 0.1 eV than the difference between the ionization potential of the donor semiconductor material and the ionization potential of the second charge blocking layer.

In this case, the energy barrier when the electrons generated in the photoelectric conversion layer migrate to the first electrode is sufficiently larger than the energy barrier when the holes generated in the photoelectric conversion layer migrate to the second electrode. Therefore, the parasitic sensitivity of the imaging device can be further reduced.

For example, the first charge blocking layer may contain the donor semiconductor material.

In this case, the first charge blocking layer is formed of the donor semiconductor material contained in the photoelectric conversion layer. Therefore, in the imaging device obtained, the parasitic sensitivity can be reduced using a smaller number of materials.

An imaging device according to another aspect of the present disclosure includes a plurality of pixels. Each of the plurality of pixels includes a first electrode, a second electrode, a photoelectric conversion layer that is located between the first electrode and the second electrode, that contains a donor semiconductor material and an acceptor semiconductor material, and that generates a pair of an electron and a hole, a first charge blocking layer located between the first electrode and the photoelectric conversion layer, a second charge blocking layer located between the second electrode and the photoelectric conversion layer, and a charge storage region that is electrically connected to the second electrode and that stores the electron as a signal charge. The electron affinity of the second charge blocking layer is equal to or smaller than the electron affinity of the acceptor semiconductor material. The ionization potential of the first charge blocking layer is larger than the ionization potential of the donor semiconductor material. The difference between the ionization potential of the donor semiconductor material and the ionization potential of the first charge blocking layer is larger than the difference between the electron affinity of the acceptor semiconductor material and the electron affinity of the second charge blocking layer.

When these relations among the electron affinities and the ionization potentials hold, the energy barrier when the holes generated in the photoelectric conversion layer migrate to the first electrode is larger than the energy barrier when the electrons generated in the photoelectric conversion layer migrate to the second electrode. Therefore, the holes are more likely to remain in the photoelectric conversion layer than the electrons. In this case, when the electrons stored in the charge storage region are read as signal charges, the holes that are more likely to remain in the photoelectric conversion layer recombine with electrons remaining in the photoelectric conversion layer at the timing at which the migration of electrons to the charge storage region is to be stopped, so that the electrons are easily annihilated. In this manner, migration of electrons to the charge storage region is prevented irrespective of the amount of light applied to the photoelectric conversion layer. Therefore, the parasitic sensitivity of the imaging device can be reduced.

For example, the imaging device may further include a voltage supply circuit that is electrically connected to the first electrode and that provides a potential difference between the first electrode and the second electrode, and the voltage supply circuit may supply a first voltage to the first electrode in a first period and may supply a second voltage different from the first voltage to the first electrode in a second period.

In this case, by setting the first voltage and the second voltage according to the characteristics of the photoelectric conversion layer, the timing of photoelectric conversion and the timing of reading can be separated from each other, and the parasitic sensitivity can be further reduced.

For example, the photoelectric conversion efficiency of the plurality of pixels in the first period may differ from the photoelectric conversion efficiency of the plurality of pixels in the second period.

In this case, the first voltage and the second voltage are selected such that the change in current density according to the amount of light incident on the photoelectric conversion layer in the first period differs from that in the second period. For example, when holes and electrons in the photoelectric conversion layer are recombined in a period in which the change in current density according to the amount of light is small, the parasitic sensitivity can be reduced.

For example, the imaging device may be operated in a global shutter mode in which the same timing is applied to an exposure period of each of the plurality of pixels, and the signal charge may be stored in the charge storage region in the exposure period.

In this case, since all the pixels can be exposed to light at the same timing, a phenomenon such as distortion of the image of an object that is specific to a rolling shutter mode is prevented, and the parasitic sensitivity can be reduced in the imaging device obtained.

For example, the first period may be the exposure period, and the second period may be a non-exposure period different from the exposure period.

When the second period is used as the non-exposure period for signal reading as described above, the global shutter mode can be performed with the parasitic sensitivity reduced in the second period.

For example, when the voltage supply circuit supplies the second voltage to the first electrode, the electron and the hole in the photoelectric conversion layer may be recombined.

As described above, the second voltage that allows the electrons and holes to be recombined is supplied during the second period. Therefore, when the second period, which is the non-exposure period, is used as a signal reading period, the density of the current generated from the photoelectric conversion layer in the non-exposure period is unlikely to be affected by the amount of light incident on the photoelectric conversion layer. Therefore, the parasitic sensitivity in the second period can be reduced.

For example, when the voltage supply circuit supplies the first voltage to the first electrode, the photoelectric conversion layer may exhibit sensitivity to photoelectric conversion.

Since the voltage that allows the photoelectric conversion layer to exhibit the sensitivity is supplied to the first electrode in the first period serving as the exposure period, the parasitic sensitivity of the imaging device obtained can be reduced while its S/N ratio is improved.

For example, the first period and the second period may be included in at least one exposure period in one frame, and the signal charge may be stored in the charge storage region in the at least one exposure period.

In this case, the first and second periods in which different voltages are supplied to the first electrode are included in the at least one exposure period in one frame. Therefore, in the imaging device, the sensitivity to photoelectric conversion can be controlled by adjusting the magnitudes of the first and second voltages or the lengths of the first and second periods. Therefore, in the above imaging device having an electronic ND (Neutral Density) function, the parasitic sensitivity can be reduced.

For example, the donor semiconductor material may be a donor organic semiconductor material, and the acceptor semiconductor material may be an acceptor organic semiconductor material.

In this case, a thin film serving as the photoelectric conversion layer can be easily formed.

For example, the thickness of the first charge blocking layer may be equal to or more than 5 nm.

In this case, the function of the first charge blocking layer is easily maintained, and the parasitic sensitivity can be further reduced.

For example, the thickness of the second charge blocking layer may be equal to or more than 5 nm.

In this case, the function of the second charge blocking layer is easily maintained, and the parasitic sensitivity can be further reduced.

Next, an embodiment will be described with reference to the drawings.

The embodiment described below shows general or specific examples. Numerical values, shapes, components, arrangements and connections of the components, steps, the order of the steps, etc. shown in the following embodiment are merely examples and are not intended to limit the present disclosure. Among the components in the following embodiment, components not described in an independent claim representing the broadest concept will be described as optional components. The drawings are not necessarily strictly accurate illustrations. In the drawings, the same reference numerals are given to substantially the same components, and redundant description thereof will be omitted or simplified.

Embodiment

[Photoelectric Conversion Element]

First, a photoelectric conversion element included in an imaging device according to the present embodiment will be described using FIG. 1. The photoelectric conversion element in the present embodiment is a charge-reading type photoelectric conversion element. FIG. 1 is a schematic cross-sectional view showing the structure of the photoelectric conversion element 10 in the present embodiment.

As shown in FIG. 1, the photoelectric conversion element 10 is supported on a support substrate 1 and includes: a pair of electrodes including an upper electrode 6 and a lower electrode 2; a photoelectric conversion layer 4 located between the upper electrode 6 and the lower electrode 2; a hole blocking layer 5 located between the upper electrode 6 and the photoelectric conversion layer 4; and an electron blocking layer 3 located between the lower electrode 2 and the photoelectric conversion layer 4. In the present embodiment, the upper electrode 6 is an example of the first electrode, and the lower electrode 2 is an example of the second electrode. The hole blocking layer 5 is an example of the first charge blocking layer, and the electron blocking layer 3 is an example of the second charge blocking layer.

Next, the components of the photoelectric conversion element 10 in the present embodiment will be described.

The support substrate 1 may be any substrate that is used to support a general photoelectric conversion element and may be, for example, a glass substrate, a quartz substrate, a semiconductor substrate, or a plastic substrate.

The lower electrode 2 is formed of a metal, a metal nitride, a metal oxide, polysilicon having electric conductivity imparted thereto, etc. Examples of the metal include aluminum, copper, titanium, and tungsten. Examples of a method for imparting electric conductivity to the polysilicon include doping with an impurity.

The upper electrode 6 is, for example, a transparent electrode formed of a transparent conductive material. Examples of the material of the upper electrode 6 include transparent conducting oxides (TCOs), ITO (Indium Tin Oxide), IZO (Indium Zinc Oxide), AZO (Aluminum-doped Zinc Oxide), FTO (Fluorine-doped Tin Oxide), $SnO_2$, and $TiO_2$. The upper electrode 6 may be produced appropriately using a single metal material such as TCO, aluminum (Al), or gold (Au) or a combination of a plurality of metal materials according to a desired transmittance.

The material of the lower electrode 2 and the material of the upper electrode 6 are not limited to the above conductive materials, and any other material may be used. For example, the lower electrode 2 may be a transparent electrode.

To produce the lower electrode 2 and the upper electrode 6, any of various methods may be used depending on the material used. When, for example, ITO is used, an electron beam method, a sputtering method, a resistive heating vapor deposition method, a chemical reaction method such as a sol-gel method, or a method including applying an indium tin oxide dispersion may be used. In this case, to produce the lower electrode 2 and the upper electrode 6, ITO films may be first deposited, and then UV-ozone treatment, plasma treatment, etc. may be performed.

The photoelectric conversion layer 4 contains a donor semiconductor material and an acceptor semiconductor material. The photoelectric conversion layer 4 is produced using, for example, organic semiconductor materials. Examples of the method for producing the photoelectric conversion layer 4 include wet methods such as a coating method using spin coating and dry methods such as a vacuum vapor deposition method. The vacuum vapor deposition method is a method in which the materials of the layer are heated in a vacuum to vaporize them and deposited on a substrate. The photoelectric conversion layer 4 is, for example, a mixture film having a bulk hetero structure containing a donor organic semiconductor material and an acceptor organic semiconductor material. The photoelectric conversion layer 4 containing the donor organic semiconductor material and the acceptor organic semiconductor material can be formed easily as a thin film. Specific examples of the donor organic semiconductor material and the acceptor organic semiconductor material will be shown below.

Examples of the donor organic semiconductor material include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, naphthalocyanine compounds, subphthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (such as naphthalene derivatives, anthracene derivatives, phenanthrene derivatives, tetracene derivatives, pyrene derivatives, perylene derivatives, and fluoranthene derivatives), and metal complexes including a nitrogen-containing heterocyclic compound as a ligand.

Examples of the acceptor organic semiconductor material include fullerenes (such as C60 fullerene and C70 fullerene), fullerene derivatives (such as PCBM (phenyl C61 butyric acid methyl ester) and ICBA (indene C60 bisadduct)), fused aromatic carbocyclic compounds (such as naphthalene derivatives, anthracene derivatives, phenanthrene derivatives, tetracene derivatives, pyrene derivatives, perylene derivatives, and fluoranthene derivatives), 5- to 7-membered heterocyclic compounds containing a nitrogen atom, an oxygen atom, or a sulfur atom (such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine), polyarylene compounds, fluorene compounds, cyclopentadiene compounds, silyl compounds, and metal complexes including a nitrogen-containing heterocyclic compound as a ligand.

The donor organic semiconductor material and the acceptor organic semiconductor material are not limited to the above examples. Any low-molecular weight or high-molecular weight organic compound can be used as the donor organic semiconductor material or the acceptor organic semiconductor material included in the photoelectric conversion layer 4 so long as the organic compound can be used to deposit the photoelectric conversion layer using a dry or wet method.

The photoelectric conversion layer 4 may contain, as the donor semiconductor material and the acceptor semiconductor material, semiconductor materials other than those described above. The photoelectric conversion layer 4 may contain, as a semiconductor material, for example, a silicon semiconductor, a compound semiconductors, quantum dots, a perovskite material, carbon nanotubes, etc. or a mixture of two or more of them.

The photoelectric conversion element 10 in the present embodiment includes the electron blocking layer 3 disposed between the lower electrode 2 and the photoelectric conversion layer 4 and the hole blocking layer 5 disposed between the upper electrode 6 and the photoelectric conversion layer 4. By disposing the electron blocking layer 3 and the hole blocking layer 5, injection of charges from the electrodes can be prevented, and the amount of miscellaneous signals having an adverse effect on the SN ratio can be reduced.

The thickness of the electron blocking layer 3 is, for example, equal to or larger than 5 nm. In this case, the function of the electron blocking layer 3 can be easily maintained. From the viewpoint of preventing a reduction in the photoelectric conversion efficiency of the photoelectric conversion element 10, the thickness of the electron blocking layer 3 may be equal to or less than 100 nm.

The thickness of the hole blocking layer 5 is, for example, equal to or larger than 5 nm. In this case, the function of the hole blocking layer 5 can be easily maintained. From the viewpoint of preventing a reduction in the photoelectric conversion efficiency of the photoelectric conversion element 10, the thickness of the hole blocking layer 5 may be equal to or less than 100 nm.

The materials used for the electron blocking layer 3 and the hole blocking layer 5 are semiconductor materials having energy bands described later. The electron blocking layer 3 and the hole blocking layer 5 are formed of, for example, organic semiconductor materials. The materials forming the electron blocking layer 3 and the hole blocking layer 5 are not limited to the organic semiconductor materials, and oxide semiconductors, nitride semiconductors, etc. and composite materials thereof may be used.

The hole blocking layer 5 may contain, as a main material, the donor organic semiconductor material contained in the photoelectric conversion layer 4. For example, the hole blocking layer 5 is formed of the donor organic semiconductor material contained in the photoelectric conversion layer 4. When the hole blocking layer 5 contains the donor organic semiconductor material contained in the photoelectric conversion layer 4, the photoelectric conversion element 10 can be obtained using a smaller number of materials. In the case where the photoelectric conversion layer 4 and the hole blocking layer 5 are in contact with each other as illustrated, when the hole blocking layer 5 contains the same donor organic semiconductor material as that contained in the photoelectric conversion layer 4, the adhesion at the interface between the photoelectric conversion layer 4 and the hole blocking layer 5 is improved.

Figure 2:
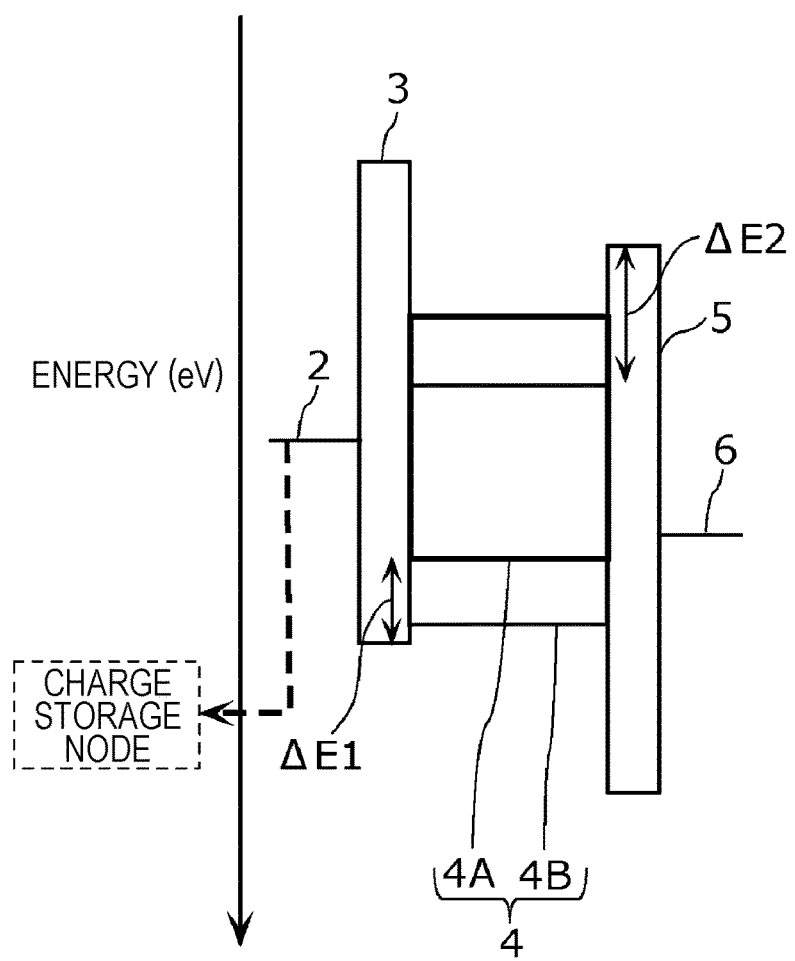
FIG. 2 is an exemplary energy band diagram of the photoelectric conversion element in the embodiment.

FIG. 2 is an exemplary energy band diagram of the photoelectric conversion element 10 shown in FIG. 1. In FIG. 2, the energy bands of the layers are depicted as rectangles.

The photoelectric conversion layer 4 generates electron-hole pairs under irradiation with light. The generated electron-hole pairs are separated into electron and holes under an electric field applied to the photoelectric conversion layer 4. The electrons and holes under the electric field migrate toward the lower electrode 2 or the upper electrode 6. A semiconductor material that donates the electrons in the electron-hole pairs generated by light absorption to the other material is the donor semiconductor material, and a semiconductor material that accepts the electrons is the acceptor semiconductor material. The donor organic semiconductor material is an example of the donor semiconductor material, and the acceptor organic semiconductor material is an example of the acceptor semiconductor material. When the photoelectric conversion layer 4 is irradiated with light, the donor semiconductor material, for example, generates electron-hole pairs and donates the electrons to the acceptor semiconductor material. When two different organic semiconductor materials are used, which of them functions as the donor semiconductor material and which of them functions as the acceptor semiconductor material are generally determined by the relative positions of the HOMO (Highest Occupied Molecular Orbital) and LUMO (Lowest Unoccupied Molecular Orbital) energy levels of the two organic semiconductor materials at the contact interface. In each rectangle in FIG. 2 that represents an energy band, the upper edge is the LUMO energy level, and the lower edge is the HOMO energy level.

As shown in FIG. 2, one of the two organic semiconductor materials that has an electron affinity, which is the energy difference between the vacuum level and the LUMO, that is smaller than that of the other serves as a donor organic semiconductor material 4A used as the donor semiconductor material, and the other one whose electron affinity is larger serves as an acceptor organic semiconductor material 4B used as the acceptor semiconductor material.

As shown in FIG. 2, in the photoelectric conversion element 10 in the present embodiment, the ionization potential of the electron blocking layer 3, which is the energy difference between the vacuum level and its HOMO, is equal to or larger than the ionization potential of the donor organic semiconductor material 4A in the photoelectric conversion layer 4. The electron affinity of the electron blocking layer 3 is, for example, equal to or less than the electron affinity of the acceptor organic semiconductor material 4B in the photoelectric conversion layer 4.

The electron affinity of the hole blocking layer 5 is smaller than the electron affinity of the acceptor organic semiconductor material 4B in the photoelectric conversion layer 4. The ionization potential of the hole blocking layer 5 is, for example, equal to or larger than the ionization potential of the donor organic semiconductor material 4A in the photoelectric conversion layer 4.

The difference in electron affinity between the hole blocking layer 5 and the acceptor organic semiconductor material 4B in the photoelectric conversion layer 4, which is denoted by $\Delta E2$ in FIG. 2, is larger than the difference in ionization potential between the electron blocking layer 3 and the donor organic semiconductor material 4A in the photoelectric conversion layer 4, which is denoted by $\Delta E1$ in FIG. 2.

As the material of the electron blocking layer 3 and the material of the hole blocking layer 5, materials that satisfy the above magnitude relations between the energies are selected from, for example, the above exemplified donor and acceptor organic semiconductor materials.

As shown in FIG. 2, the lower electrode 2 is electrically connected to a charge storage node 34 described later. The charge storage node 34 is an example of the charge storage region and stores holes generated in the photoelectric conversion layer 4.

Figure 3A:
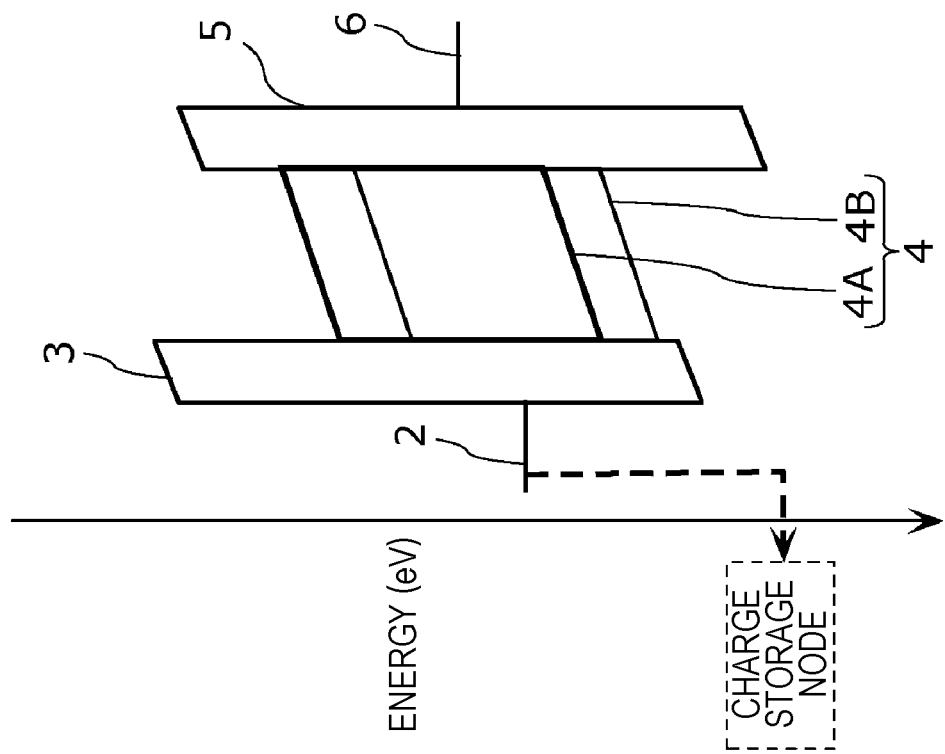
FIG. 3A is an exemplary energy band diagram of the photoelectric conversion element in the embodiment when a reverse bias voltage is applied.
Figure 3B:
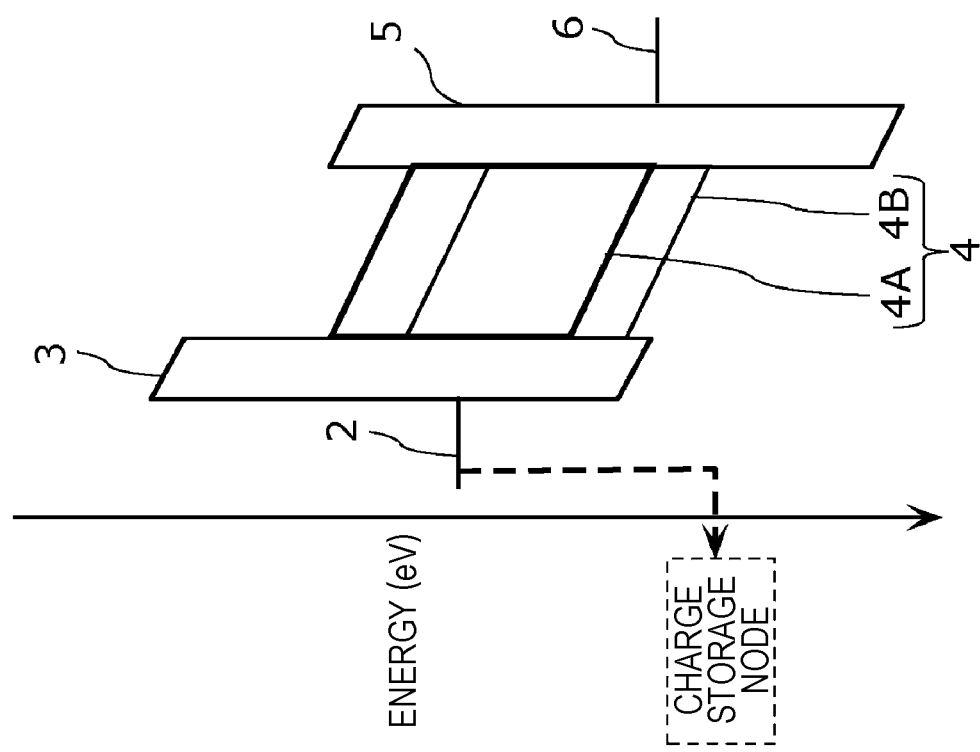
FIG. 3B is an exemplary energy band diagram of the photoelectric conversion element in the embodiment when a forward bias voltage is applied.

FIG. 3A is an exemplary energy band diagram of the photoelectric conversion element 10 when a reverse bias voltage is applied between the lower electrode 2 and the upper electrode 6. FIG. 3B is an exemplary energy band diagram of the photoelectric conversion element 10 when a forward bias voltage is applied between the lower electrode 2 and the upper electrode 6. In the following description of the specification, a voltage when the voltage applied to the upper electrode 6 is higher than the voltage applied to the lower electrode 2 is a reverse direction bias voltage, i.e., a reverse bias voltage, and a voltage when the voltage applied to the upper electrode 6 is lower than the voltage applied to the lower electrode 2 is a forward direction bias voltage, i.e., a forward bias voltage.

For example, in a photoelectric conversion mode that is the state showing in FIG. 3A, electron-hole pairs are generated in the photoelectric conversion layer 4. Then the holes are migrated to the lower electrode 2, and the electrons are migrated to the upper electrode 6. Next, in a reading mode that is the state shown in FIG. 3B, the holes stored in the charge storage node 34 through the lower electrode 2 are read as a signal.

In the photoelectric conversion mode, the energy barrier when the holes migrate from the photoelectric conversion layer 4 to the lower electrode 2 is $\Delta E1$, and the energy barrier when the electrons migrate from the photoelectric conversion layer 4 to the upper electrode 6 is $\Delta E2$. Since the energy barrier $\Delta E2$ for migration of the electrons is larger than the energy barrier $\Delta E1$ for migration of the holes, the electrons are less likely to migrate than the holes. Therefore, in the photoelectric conversion mode, the electrons are more likely to remain in the photoelectric conversion layer 4 than the holes. In this case, when the photoelectric conversion mode is changed to the reading mode, the remaining electrons and holes are recombined. Since the presence of the electrons that are more likely to remain facilitates recombination with the holes sufficiently, migration of the remaining holes to the lower electrode 2 can be prevented.

As described above, in the photoelectric conversion element 10 included in the imaging device 100 according to the present embodiment, the electron blocking layer 3 and the hole blocking layer 5 having the respective energy bands described above are used. This allows the parasitic sensitivity to be effectively reduced when the method in which holes are read from the lower electrode 2 is used.

[Imaging Device]

Figure 4:
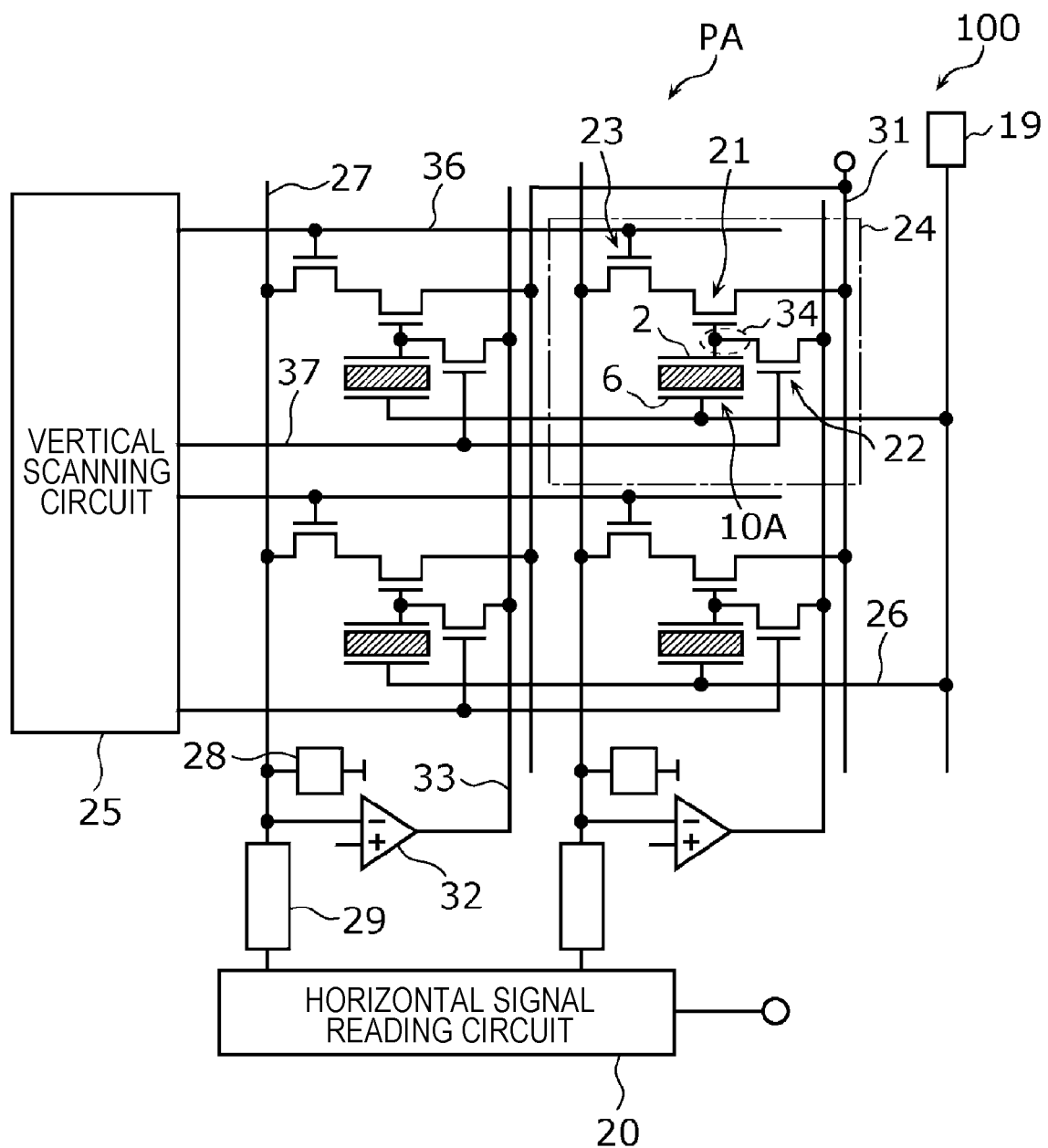
FIG. 4 is an illustration showing an example of the circuit structure of an imaging device according to the embodiment.
Figure 5:
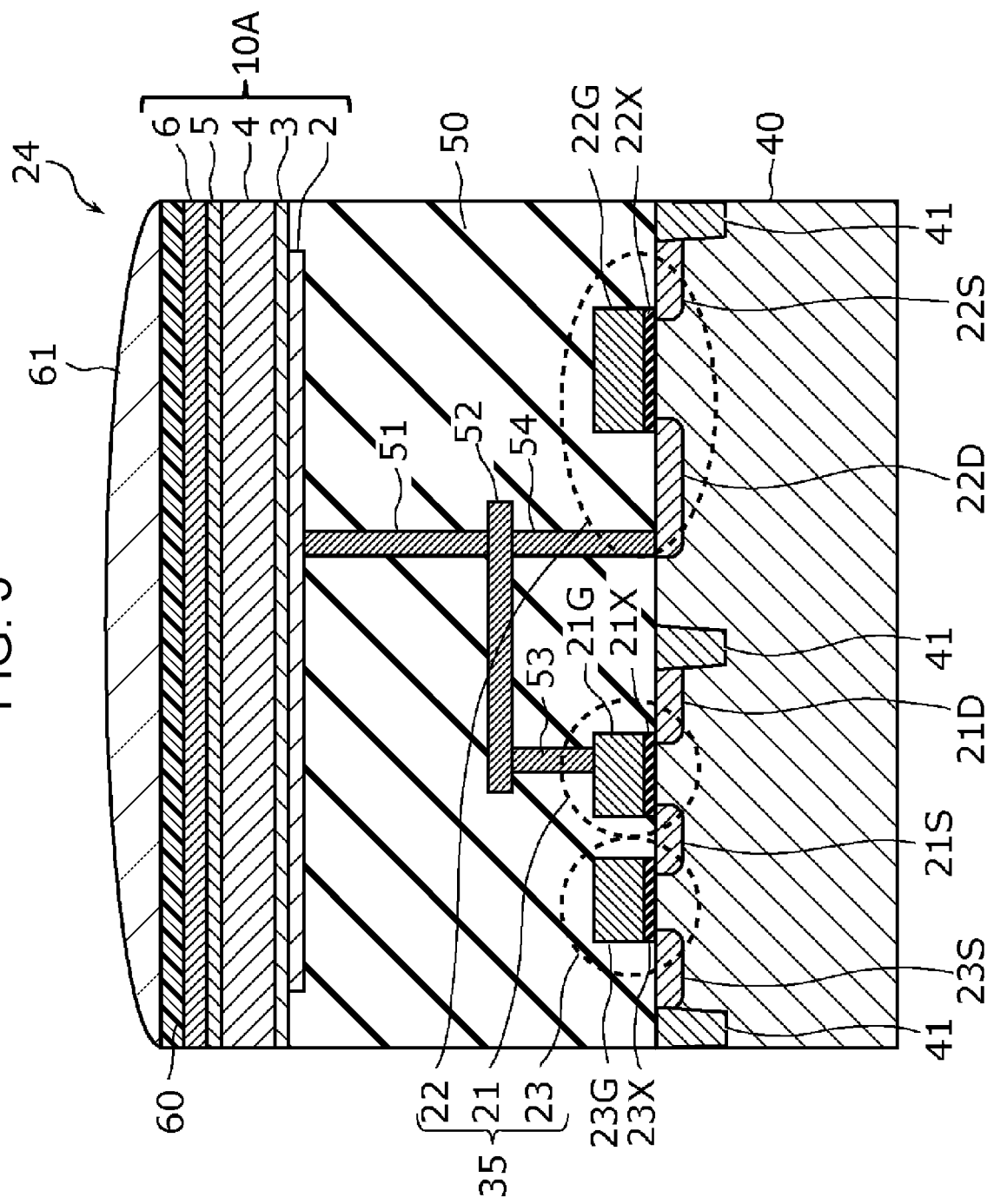
FIG. 5 is a schematic cross-sectional view showing the device structure of a pixel in the imaging device according to the embodiment.

The imaging device according to the present embodiment will next be described using FIGS. 4 and 5. FIG. 4 is an illustration showing an example of the circuit structure of the imaging device 100 equipped with photoelectric conversion units 10A each using the photoelectric conversion element 10 shown in FIG. 1. FIG. 5 is a schematic cross-sectional view showing an example of the device structure of a pixel 24 in the imaging device 100 according to the present embodiment.

As shown in FIGS. 4 and 5, the imaging device 100 according to the present embodiment includes a semiconductor substrate 40 and a plurality of pixels 24. Each of the plurality of pixels 24 includes: a charge detection circuit 35 disposed on the semiconductor substrate 40; a photoelectric conversion unit 10A disposed for the semiconductor substrate 40; and a charge storage node 34 electrically connected to the charge detection circuit 35 and the photoelectric conversion unit 10A. The photoelectric conversion unit 10A in each of the plurality of pixels 24 includes the photoelectric conversion element 10 described above. Specifically, each of the plurality of pixels 24 includes the upper electrode 6, the lower electrode 2, the photoelectric conversion layer 4, the hole blocking layer 5, the electron blocking layer 3, and the charge storage node 34. In the present embodiment, the charge storage node 34 is an example of the charge storage region.

The charge storage node 34 stores charges obtained in the photoelectric conversion unit 10A, and the charge detection circuit 35 detects the charges stored in the charge storage node 34. The charge detection circuit 35 disposed for the semiconductor substrate 40 may be disposed on the semiconductor substrate 40 or may be disposed in the semiconductor substrate 40.

As shown in FIG. 4, the imaging device 100 includes the plurality of pixels 24 and peripheral circuits. The imaging device 100 is an organic image sensor implemented as a one chip integrated circuit and includes a pixel array PA including the plurality of pixels 24 arranged two-dimensionally. The imaging device 100 is, for example, an imaging device operated in a global shutter mode in which exposure periods of the plurality of pixels 24 are the same. Specifically, the imaging device 100 has a global shutter function. The details of the exposure periods will be described later.

The plurality of pixels 24 are arranged two-dimensionally, i.e., in row and column directions, on the semiconductor substrate 40 to form a photosensitive region serving as a pixel region. In the example shown in FIG. 4, the pixels 24 are arrange in a matrix of two rows and two columns. In FIG. 4, the illustration of a circuit for setting the sensitivities of the pixels 24 independently (for example, a pixel electrode control circuit) is omitted for convenience of illustration. The imaging device 100 may be a line sensor. In this case, the plurality of pixels 24 may be arranged one dimensionally. In the specification, the row and column directions are the extending directions of the rows and columns, respectively. Specifically, in FIG. 4, the vertical direction in the drawing sheet is the column direction, and the horizontal direction is the row direction.

As shown in FIGS. 4 and 5, each pixel 24 includes a photoelectric conversion unit 10A and a charge storage node 34 electrically connected to a charge detection circuit 35. The charge detection circuit 35 includes an amplification transistor 21, a reset transistor 22, and an address transistor 23.

The photoelectric conversion unit 10A includes a lower electrode 2 provided as a pixel electrode and an upper electrode 6 provided as a counter electrode. The photoelectric conversion unit 10A includes the photoelectric conversion element 10 described above. A voltage for applying a prescribed bias voltage is supplied to the upper electrode 6 through a counter electrode signal line 26.

The lower electrode 2 is connected to a gate electrode 21G of the amplification transistor 21, and signal charges collected by the lower electrode 2 are stored in the charge storage node 34 located between the lower electrode 2 and the gate electrode 21G of the amplification transistor 21. In the present embodiment, the signal charges are holes. Specifically, the charge storage node 34 is electrically connected to the lower electrode 2 and stores holes generated in the photoelectric conversion layer 4.

The signal charges stored in the charge storage node 34 are applied to the gate electrode 21G of the amplification transistor 21 as a voltage corresponding to the amount of the signal charges. The amplification transistor 21 amplifies this voltage, and the amplified voltage is selectively read as a signal voltage by the address transistor 23. A source/drain electrode of the reset transistor 22 is connected to the lower electrode 2, and the reset transistor 22 resets the signal charges stored in the charge storage node 34. In other words, the reset transistor 22 resets the potential of the gate electrode 21G of the amplification transistor 21 and the potential of the lower electrode 2.

To perform the above operation selectively for the plurality of pixels 24, the imaging device 100 includes power source lines 31, vertical signal lines 27, address signal lines 36, and reset signal lines 37. These lines are connected to the pixels 24. Specifically, the power source lines 31 are connected to source/drain electrodes of the amplification transistors 21, and the vertical signal lines 27 are connected to source/drain electrodes of the address transistors 23. The address signal lines 36 are connected to gate electrodes 23G of the address transistors 23. The reset signal lines 37 are connected to gate electrodes 22G of the reset transistors 22.

The peripheral circuits include a voltage supply circuit 19, a vertical scanning circuit 25, a horizontal signal reading circuit 20, a plurality of column signal processing circuits 29, a plurality of load circuits 28, and a plurality of differential amplifiers 32.

The voltage supply circuit 19 is electrically connected to the upper electrodes 6 through counter electrode signal lines 26. The voltage supply circuit 19 supplies a voltage to each upper electrode 6 to provide a potential difference between the upper electrode 6 and the corresponding lower electrode 2. For example, the voltage supply circuit 19 supplies a first voltage in a first period such as an exposure period described later and supplies a second voltage different from the first voltage in a second period such as a non-exposure period.

The vertical scanning circuit 25 is connected to the address signal lines 36 and the reset signal lines 37, selects any of the rows of pixels 24, reads signal voltages from the selected pixels, and resets the potential of each of the lower electrodes 2. The power source lines 31 each serving as a source-follower power source supply a prescribed power source voltage to the pixels 24. The horizontal signal reading circuit 20 is electrically connected to the plurality of column signal processing circuits 29. The column signal processing circuits 29 are electrically connected to their respective columns of pixels 24 through the respective vertical signal lines 27. The load circuits 28 are electrically connected to the respective vertical signal lines 27. The load circuits 28 and the amplification transistors 21 form source follower circuits.

The plurality of differential amplifiers 32 are provided for the respective columns. Negative input terminals of the differential amplifiers 32 are connected to the respective vertical signal lines 27. Output terminals of the differential amplifiers 32 are connected to pixels 24 through feedback lines 33 provided for their respective columns.

The vertical scanning circuit 25 applies a row selection signal to the gate electrode 23G of each address transistor 23 through its corresponding address signal line 36 to control the ON/OFF of the address transistor 23. In this manner, the row to be read is scanned and selected. Signal voltages are read from pixels 24 in the selected row through the respective vertical signal lines 27. The vertical scanning circuit 25 also applies a reset signal to the gate electrode 22G of each reset transistor 22 through the corresponding reset signal line 37 to control the ON/OFF of the reset transistor 22. In this manner, the row of unit pixels 24 to be reset is selected. The vertical signal lines 27 transmit the signal voltages read from the pixels 24 selected by the vertical scanning circuit 25 to the respective column signal processing circuits 29.

The column signal processing circuits 29 perform noise suppression signal processing typified by correlated double sampling, analog-digital conversion (A/D conversion), etc.

The horizontal signal reading circuit 20 sequentially reads signals from the plurality of column signal processing circuits 29 and outputs the signals to a horizontal common signal line (not shown).

The differential amplifiers 32 are connected through the feedback lines 33 to the drain electrodes of the reset transistors 22. Therefore, the differential amplifiers 32 receive, on their negative terminals, output values of the respective address transistors 23. Each differential amplifier 32 performs a feedback operation such that the gate potential of the corresponding amplification transistor 21 is equal to a prescribed feedback voltage. In this case, the output voltage value of the differential amplifier 32 is 0 V or a positive voltage near 0 V. The feedback voltage means the output voltage of the differential amplifier 32.

As shown in FIG. 5, each pixel 24 includes the semiconductor substrate 40, the charge detection circuit 35, the photoelectric conversion unit 10A, and the charge storage node 34 (see FIG. 4).

The semiconductor substrate 40 may be, for example, an insulating substrate having a semiconductor layer disposed on its surface on the side on which the photosensitive region is to be formed and may be, for example, a p-type silicon substrate. The semiconductor substrate 40 includes impurity regions 21D, 21S, 22D, 22S, and 23S and element isolation regions 41 for electrically isolating pixels 24 from each other. The impurity regions 21D, 21S, 22D, 22S, and 23S are, for example, n-type regions. In the present embodiment, an element isolation region 41 is disposed between the impurity region 21D and the impurity region 22D. Therefore, leakage of the signal charges stored in the charge storage node 34 is prevented. Each element isolation region 41 is formed, for example, by implantation of acceptor ions under prescribed implantation conditions.

The impurity regions 21D, 21S, 22D, 22S, and 23S are, for example, diffusion regions formed in the semiconductor substrate 40. As shown in FIG. 5, the amplification transistor 21 includes the impurity region 21S, the impurity region 21D, and the gate electrode 21G. The impurity region 21S and the impurity region 21D function, for example, as a source region and a drain region, respectively, of the amplification transistor 21. A channel region of the amplification transistor 21 is formed between the impurity region 21S and the impurity region 21D.

Similarly, the address transistor 23 includes the impurity region 23S, the impurity region 21S, and the gate electrode 23G connected to one of the address signal lines 36. In this example, the amplification transistor 21 and the address transistor 23 share the impurity region 21S and are thereby electrically connected to each other. The impurity region 23S functions, for example, as a source region of the address transistor 23. The impurity region 23S is connected to one of the vertical signal lines 27 shown in FIG. 4.

The reset transistor 22 includes the impurity regions 22D and 22S and the gate electrode 22G connected to one of the reset signal lines 37. The impurity region 22S functions, for example, as a source region of the reset transistor 22. The impurity region 22S is connected to one of the reset signal lines 37 shown in FIG. 4.

An interlayer insulating layer 50 is stacked on the semiconductor substrate 40 so as to cover the amplification transistor 21, the address transistor 23, and the reset transistor 22.

Wiring layers (not shown) may be disposed in the interlayer insulating layer 50. The wiring layers are formed of a metal such as copper and may include wiring lines such as the above-described vertical signal lines 27 as part thereof. The number of insulating layers in the interlayer insulating layer 50 and the number of wiring layers disposed in the interlayer insulating layer 50 may be freely set.

Contact plugs 53, 54, and 51 and a wiring line 52 are disposed in the interlayer insulating layer 50. The contact plug 53 is electrically connected to the gate electrode 21G of the amplification transistor 21, and the contact plug 54 is connected to the impurity region 22D of the reset transistor 22. The contact plug 51 is connected to the lower electrode 2, and the wiring line 52 connects the contact plug 51, the contact plug 54, and the contact plug 53 to each other. In this manner, the impurity region 22D of the reset transistor 22 is electrically connected to the gate electrode 21G of the amplification transistor 21. In the structure exemplified in FIG. 5, the contact plugs 51, 53, and 54, the wiring line 52, the gate electrode 21G of the amplification transistor 21, and the impurity region 22D of the reset transistor 22 form at least part of the charge storage node 34.

The charge detection circuit 35 detects the signal charges collected by the lower electrode 2 and outputs a signal voltage. The charge detection circuit 35 includes the amplification transistor 21, the reset transistor 22, and the address transistor 23 and is formed on the semiconductor substrate 40.

The amplification transistor 21 includes the impurity region 21D and the impurity region 21S that are formed in the semiconductor substrate 40 and function as a drain electrode and a source electrode, respectively, and further includes a gate insulating layer 21X formed on the semiconductor substrate 40 and the gate electrode 21G formed on the gate insulating layer 21X.

The reset transistor 22 includes the impurity region 22D and the impurity region 22S that are formed in the semiconductor substrate 40 and function as a drain electrode and a source electrode, respectively, and further includes a gate insulating layer 22X formed on the semiconductor substrate 40 and the gate electrode 22G formed on the gate insulating layer 22X.

The address transistor 23 includes the impurity regions 21S and 23S that are formed in the semiconductor substrate 40 and function as a drain electrode and a source electrode, respectively, and further includes a gate insulating layer 23X formed on the semiconductor substrate 40 and the gate electrode 23G formed on the gate insulating layer 23X. The impurity region 21S is connected in series to the amplification transistor 21 and the address transistor 23.

The photoelectric conversion unit 10A described above is disposed on the interlayer insulating layer 50. In other words, in the present embodiment, the plurality of pixels 24 forming the pixel array PA are formed on the semiconductor substrate 40. The plurality of pixels 24 arranged two-dimensionally on the semiconductor substrate 40 form the photosensitive region. The distance between two adjacent pixels 24 (i.e., the pixel pitch) may be, for example, about 2 μm.

The photoelectric conversion unit 10A has the structure of the photoelectric conversion element 10 described above.

A color filter 60 is formed on the photoelectric conversion unit 10A, and a microlens 61 is formed on the color filter 60.

The color filter 60 is formed, for example, as an on-chip color filter using patterning, and, for example, a photosensitive resin containing a dye or a pigment dispersed therein is used for the color filter 60. The microlens 61 is formed, for example, as an on-chip microlens, and an ultraviolet sensitive material, for example, is used for the microlens 61.

To produce the imaging device 100, a general semiconductor production process can be used. In particular, when a silicon substrate is used as the semiconductor substrate 40, various silicon semiconductor processes can be utilized.

Figure 6:
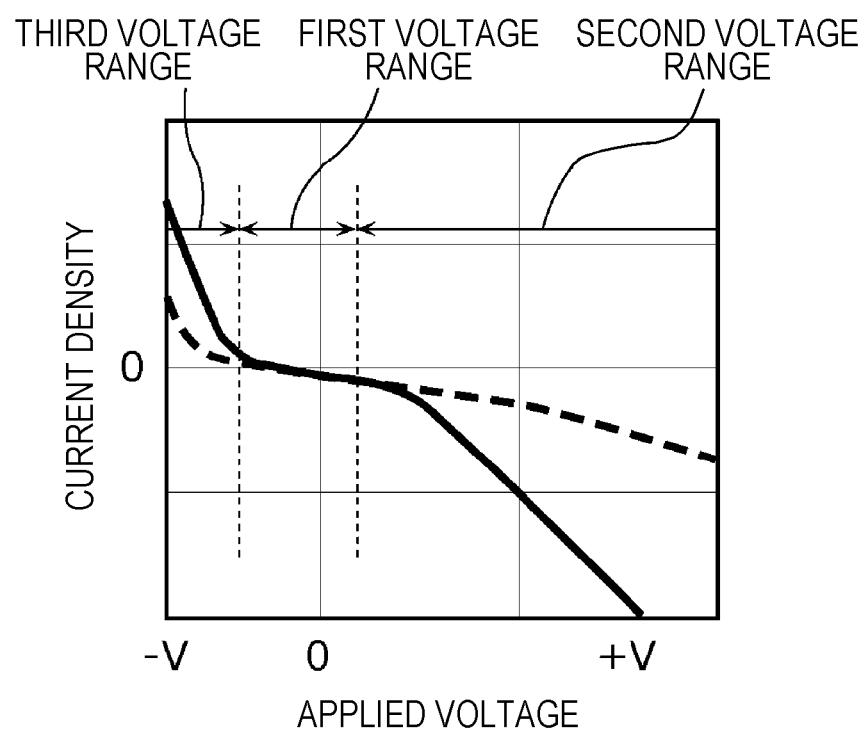
FIG. 6 is a schematic graph showing an example of the current-voltage characteristics of a photoelectric conversion layer in the embodiment.

FIG. 6 is a schematic graph showing an example of the current-voltage (I-V) characteristics of the photoelectric conversion layer 4. In FIG. 6, a thick solid graph line represents the exemplary I-V characteristics of the photoelectric conversion layer 4 when a voltage is applied between the lower electrode 2 and the upper electrode 6 under irradiation with light. In FIG. 6, an example of the I-V characteristics of the photoelectric conversion layer 4 when a voltage is applied between the lower electrode 2 and the upper electrode 6 without irradiation with light is shown by a thick broken line.

As shown in FIG. 6, the photoelectric current characteristics of the photoelectric conversion layer 4 in the present embodiment is broadly characterized by a first voltage range, a second voltage range, and a third voltage range. In the first voltage range, the dependence of the change in a current in the photoelectric conversion layer 4 on the bias voltage applied between the lower electrode 2 and the upper electrode 6 and on the amount of light incident on the photoelectric conversion layer 4 is small. Specifically, in the first voltage range, the difference between the value of the current flow when light is incident on the photoelectric conversion layer 4 and the value of the current flow when no light is incident on the photoelectric conversion layer 4 is considered to be small. In the first voltage range, even when hole-electron pairs are generated due to light incident on the photoelectric conversion layer 4, the holes and electrons are recombined before they are separated from each other because the absolute value of the voltage applied between the lower electrode 2 and the upper electrode 6 is not large.

The second voltage range in FIG. 6 is a reverse bias voltage range and is a region in which the absolute value of the output current density increases as the reverse bias voltage increases. Specifically, the second voltage range is a region in which the current value increases as the amount of light incident on the photoelectric conversion layer 4 and the bias voltage applied between the lower electrode 2 and the upper electrode 6 increase.

The third voltage range is a forward bias voltage range and is a region in which the output current density increases as the forward bias voltage increases. Specifically, the third voltage range is a region in which the current increases as the bias voltage applied between the lower electrode 2 and the upper electrode 6 increases even when no light is incident on the photoelectric conversion layer 4.

FIG. 3A described above corresponds to an exemplary energy band diagram when a bias voltage in the second voltage range is applied to the photoelectric conversion element 10. FIG. 3B corresponds to an exemplary energy band diagram when a bias voltage in the first voltage range is applied to the photoelectric conversion element 10.

The photoelectric conversion unit 10A including the photoelectric conversion element 10 in the imaging device 100 according to the present embodiment includes the photoelectric conversion layer 4 that has the first voltage range in which the difference between the value of the current flow when light is incident on the photoelectric conversion layer 4 and the value of the current flow when no light is incident on the photoelectric conversion layer 4 is small. Therefore, in the imaging device 100, a global shutter function can be achieved while the parasitic sensitivity is reduced.

When the signal charges to be detected are holes, the electrons are more likely to remain in the photoelectric conversion layer 4 than the holes when the difference $\Delta E2$ in electron affinity between the acceptor organic semiconductor material 4B and the hole blocking layer 5 is larger than the difference $\Delta E1$ in ionization potential between the donor organic semiconductor material 4A and the electron blocking layer 3 as shown in FIGS. 2, 3A, and 3B. Therefore, by increasing the effect of facilitating recombination of holes and electrons when the bias voltage applied between the lower electrode 2 and the upper electrode 6 is in the first voltage range, the holes are unlikely to migrate to the lower electrode 2, and the parasitic sensitivity can thereby be reduced. For example, from the viewpoint of enhancing the effect of reducing the parasitic sensitivity, the difference $\Delta E2$ in electron affinity between the acceptor organic semiconductor material 4B and the hole blocking layer 5 may be larger by at least 0.1 eV than the difference $\Delta E1$ in ionization potential between the donor organic semiconductor material 4A and the electron blocking layer 3. From the viewpoint of further enhancing the effect of reducing the parasitic sensitivity, the difference $\Delta E2$ in electron affinity between the acceptor organic semiconductor material 4B and the hole blocking layer 5 may be larger by at least 0.3 eV than the difference $\Delta E1$ in ionization potential between the donor organic semiconductor material 4A and the electron blocking layer 3.

Figure 7:
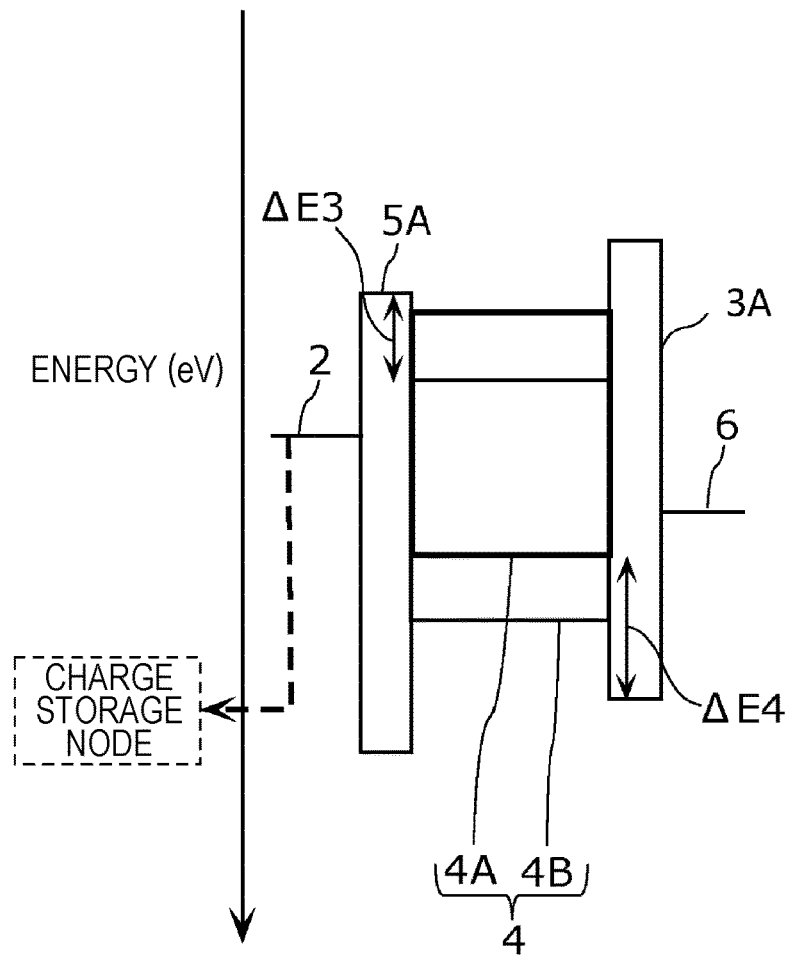
FIG. 7 is an exemplary energy band diagram of another photoelectric conversion element in the embodiment.

When the signal charges to be detected are electrons, a hole blocking layer serving as an example of the second charge blocking layer may be disposed between the lower electrode 2 and the photoelectric conversion layer 4, and an electron blocking layer serving as an example of the first charge blocking layer may be disposed between the upper electrode 6 and the photoelectric conversion layer 4. In this structure, the lower electrode 2 may be electrically connected to the charge storage node 34. Specifically, the imaging device according to the present embodiment may include the upper electrode 6, the lower electrode 2, the photoelectric conversion layer 4 located between the upper electrode 6 and the lower electrode 2, the hole blocking layer located between the lower electrode 2 and the photoelectric conversion layer 4, the electron blocking layer located between the upper electrode 6 and the photoelectric conversion layer 4, and the charge storage node 34 that is electrically connected to the lower electrode 2 and stores electrons. FIG. 7 is an exemplary energy band diagram of another photoelectric conversion element in the present embodiment. FIG. 7 shows the energy bands in another example of the photoelectric conversion element in the imaging device according to the present embodiment, i.e., the energy bands of the photoelectric conversion element including the upper electrode 6, the lower electrode 2, the photoelectric conversion layer 4 located between the upper electrode 6 and the lower electrode 2, the hole blocking layer 5A located between the lower electrode 2 and the photoelectric conversion layer 4, and the electron blocking layer 3A located between the upper electrode 6 and the photoelectric conversion layer 4. In this case, the electron affinity of the hole blocking layer 5A is equal to or less than the electron affinity of the acceptor semiconductor material 4B, and the ionization potential of the electron blocking layer 3A is larger than the ionization potential of the donor semiconductor material 4A. In this structure, the difference $\Delta E4$ in ionization potential between the donor organic semiconductor material 4A in the photoelectric conversion layer 4 and the electron blocking layer 3A is larger than the difference ΔE3 in electron affinity between the acceptor organic semiconductor material 4B in the photoelectric conversion layer 4 and the hole blocking layer 5A. Even in this imaging device in which electrons are stored in the charge storage node 34 and read, holes are more likely to remain in the photoelectric conversion layer 4 than electrons due to the same mechanism as that in the imaging device 100 in which holes are stored in the charge storage node 34 and read, so that the effect of reducing the parasitic sensitivity can be obtained.

[Operation of Imaging Device]

Next, the operation of the imaging device 100 will be described with reference to FIGS. 8 and 9. In this case, holes are used as the signal charges as described above.

Figure 8:
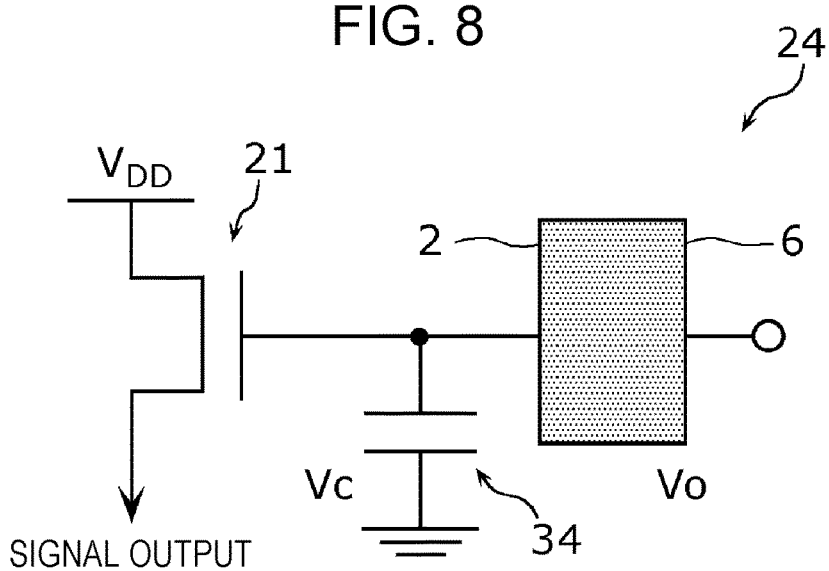
FIG. 8 is a schematic illustration showing part of the circuit structure of a pixel in the embodiment.

FIG. 8 is a schematic illustration showing part of the circuit structure of a pixel 24. For the sake of simplification of the description, one end of the charge storage node 34 shown is grounded, and its potential is zero. This state corresponds to the state in which, for example, the feedback lines 33 shown in FIG. 4 are set to 0 V. In this state, Vc is zero, where Vc is the voltage of the charge storage node 34.

The voltage supply circuit 19 shown in FIG. 4 supplies different voltages to each upper electrode 6 through the corresponding counter electrode signal line 26 during different periods, i.e., the exposure period that is an example of the first period and the non-exposure period that is an example of the second period. In the specification, the "exposure period" means a period for storing electrons or holes generated by photoelectric conversion as signal charges in the charge storage node 34. Specifically, the "exposure period" may be referred to as a "charge storing period." In the specification, a period other than the exposure period during the operation of the imaging device is referred to as the "non-exposure period." The "non-exposure period" may be a period in which light directed to the photoelectric conversion unit 10A is shielded or may be a period in which, although the photoelectric conversion unit 10A is irradiated with light, substantially no charges are stored in the charge storage node 34.

In the initial state, the potential difference between the lower electrode 2 and the upper electrode 6 of the photoelectric conversion unit 10A, i.e., the bias voltage applied to the photoelectric conversion layer 4, the electron blocking layer 3, and the hole blocking layer 5, is set to a value within the first voltage range. For example, the voltage supply circuit 19 supplies a voltage equal to the voltage of the lower electrode 2 to the upper electrode 6 using the counter electrode signal line 26. Let the voltage supplied to the upper electrode 6 be V2. Suppose that V2 is equal to a reference voltage Vref. In this case, let the bias voltage applied to the photoelectric conversion unit 10A be Vo. Then Vo=V2−Vc, and Vo=0.

Next, the operation in the exposure period will be described. At the start of the exposure period, the voltage supply circuit 19 supplies the voltage V2 to the upper electrode 6 using the counter electrode signal line 26 such that a voltage in the second voltage range, i.e., a reverse bias voltage, is applied to the photoelectric conversion unit 10A. Specifically, in the exposure period, the voltage supply circuit 19 supplies the voltage V2 to the upper electrode 6 such that the photoelectric conversion layer 4 has sensitivity to photoelectric conversion. For example, when the photoelectric conversion layer 4 is formed of an organic semiconductor material, V2 is a voltage of several V to about 10 V. In this manner, holes are stored as signal charges to the charge storage node 34 of the pixel 24 in an amount corresponding to the amount of light incident on the photoelectric conversion layer 4.

Next, the operation in the non-exposure period will be described. After the end of the exposure period, the voltage supply circuit 19 supplies the voltage V2 to the upper electrode 6 using the counter electrode signal line 26 such that a voltage in the first voltage range is applied to the photoelectric conversion unit 10A. Specifically, in the non-exposure period, the voltage supply circuit 19 supplies, to the upper electrode 6, the voltage V2 that allows electrons and holes in the photoelectric conversion layer 4 to recombine. For example, the voltage V2 supplied to the upper electrode 6 is set to the reference voltage Vref. Holes have been stored in the charge storage node 34 of each pixel 24 in an amount corresponding to the amount of light incident on the photoelectric conversion layer 4 during the exposure period, and the values of Vc differ for different pixels 24. In a pixel 24 which is not exposed to light and in which Vc is unchanged, Vo is zero because Vo=V2−Vc. However, in a pixel 24 in which Vc has been changed, Vo is not zero. Suppose that the values of Vc differ for different pixels 24. In this case, when the width of the first voltage range is sufficiently large, the voltage V2 can be set such that the voltage Vo applied to the photoelectric conversion unit 10A of each pixel 24 falls within the first voltage range. Variations in the value of the voltage Vc that fall within the first voltage range correspond to the width of the dynamic range. For example, when the width of the first voltage range is equal to or larger than 0.5 V, a dynamic range equal to or more than 80 dB that corresponds to that of human eyes can be obtained in an imaging device with a conversion gain of 50 μV/e⁻.

With the voltage V2 supplied to the upper electrode 6 of each pixel 24 such that the voltage Vo falls within the first voltage range, holes are unlikely to migrate to the charge storage node 34 even when light is incident on the pixel 24. Specifically, the voltage supply circuit 19 supplies a voltage to the upper electrodes 6 of the plurality of pixels 24 such that the photoelectric conversion efficiency of the plurality of pixels 24, specifically the photoelectric conversion units 10A, in the exposure period differs from that in the non-exposure period. Moreover, holes stored in the charge storage nodes 34 are unlikely to be discharged to the lower electrodes 2, and charges supplied from the voltage supply circuit 19 are unlikely to flow to the charge storage nodes 34 through the lower electrodes 2.

Therefore, holes are stored in the charge storage node 34 of each pixel 24 with the amount corresponding to the amount of light incident on the photoelectric conversion layer 4 maintained. Specifically, the holes stored in the charge storage node 34 of each pixel 24 can be maintained even when light is again incident on the photoelectric conversion layer 4 unless the holes in the charge storage node 34 are reset. In this case, even when the reading operation is performed row-by-row in the non-exposure period, additional holes are unlikely to be stored during the reading operation. Therefore, rolling distortion, which is likely to occur in the rolling shutter mode, does not occur. Thus, for example, a global shutter function can be obtained using a simple pixel circuit such as that of the pixels 24 without providing a transfer transistor and an additional storage capacity. Since the pixel circuit is simple, the pixels 24 in the imaging device 100 can be reduced in size advantageously.

Figure 9:
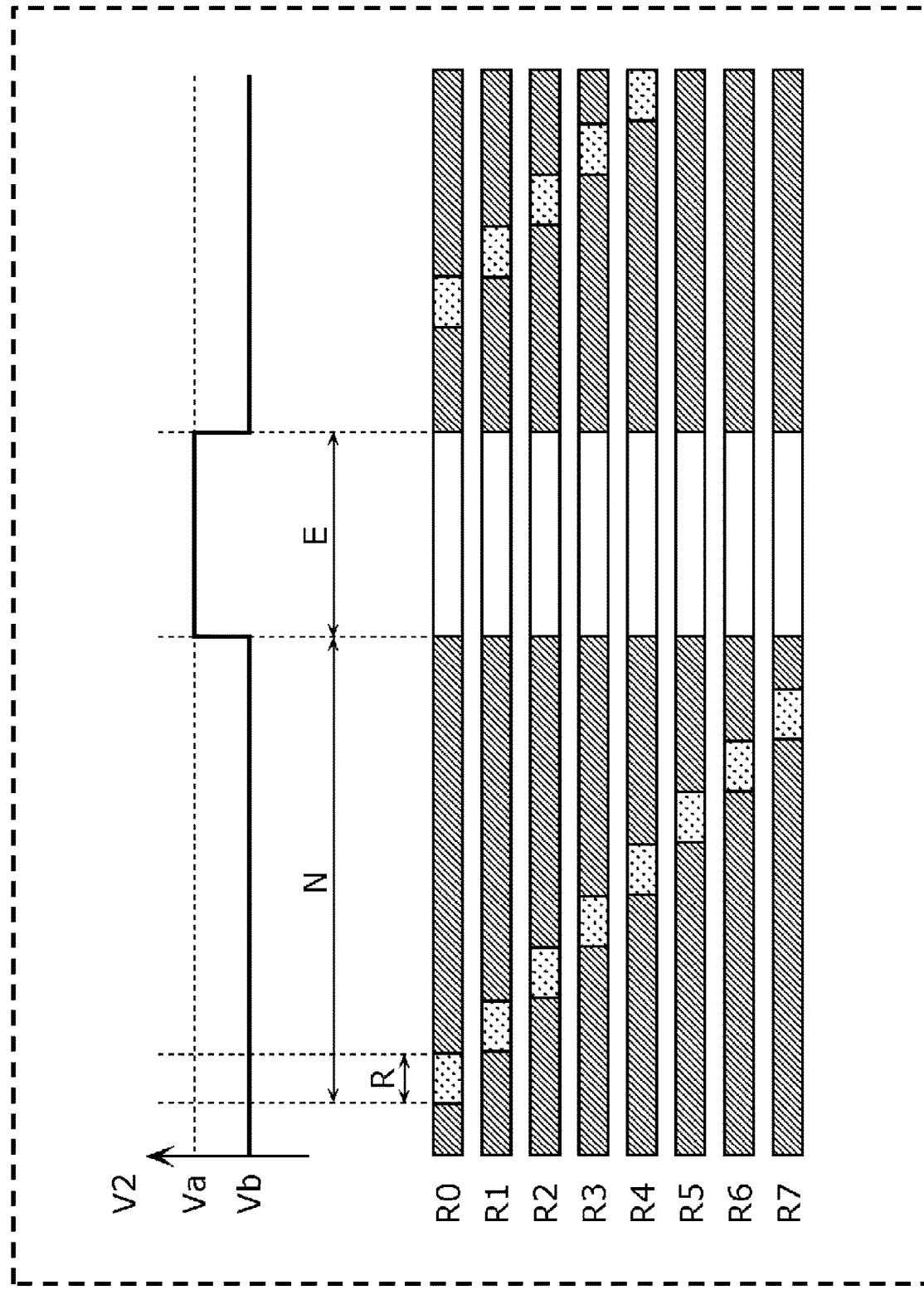
FIG. 9 is a timing chart showing an example of a voltage supplied to an upper electrode of a photoelectric conversion unit in the embodiment and operation timings of rows of an pixel array in the imaging device.

FIG. 9 is a timing chart showing an example of the voltage V2 supplied to the upper electrodes 6 of the photoelectric conversion units 10A and operation timings of rows of the pixel array PA of the imaging device 100. For ease of description, FIG. 9 shows the changes in the voltage V2 and exposure and signal reading timings for only rows R0 to R7 in the pixel array PA. In the imaging device 100, the voltage supply circuit 19 supplies the voltage V2 to the upper electrodes 6 as follows. In the non-exposure period N, the voltage supply circuit 19 supplies, as the voltage V2, a voltage Vb that allows the voltage Vo to fall within the first voltage range. In the exposure period E, the voltage supply circuit 19 supplies, as the voltage V2, a voltage Va that allows the voltage Vo to fall within the second voltage range. As shown in FIG. 9, in the non-exposure period N, signal reading R is performed such that signals are read sequentially from pixels 24 in the rows R0 to R7. The start timings of the exposure periods E of the pixels in the rows R0 to R7 are all the same, and the end timings of the exposure periods E of the pixels in the rows R0 to R7 are also all the same. Specifically, in the imaging device 100, a global shutter function is achieved in which all the rows in the pixel array PA are exposed to light simultaneously and signals are read sequentially row-by-row from the pixels 24.

As described above, in the imaging device 100 according to the present embodiment, the ionization potential of the electron blocking layer 3 is equal to or larger than the ionization potential of the donor organic semiconductor material 4A, and the electron affinity of the hole blocking layer 5 is smaller than the electron affinity of the acceptor organic semiconductor material 4B. Moreover, the difference ΔE2 in electron affinity between the acceptor organic semiconductor material 4B and the hole blocking layer 5 is larger than the difference ΔE1 in ionization potential between the donor organic semiconductor material 4A and the electron blocking layer 3.

In this case, the energy barrier ΔE2 when the electrons generated in the photoelectric conversion layer 4 migrate to the upper electrode 6 is larger than the energy barrier ΔE1 when the holes in the photoelectric conversion layer 4 migrate to the lower electrode 2, so that the electrons are more likely to remain in the photoelectric conversion layer 4. Therefore, when the holes stored in the charge storage node 34 connected to the lower electrode 2 are read, recombination of the holes and the electrons is facilitated, and the holes are unlikely to migrate to the charge storage node 34. In this manner, the migration of the holes to the charge storage node 34 is prevented irrespective of the amount of light applied to the photoelectric conversion layer 4. Therefore, in the imaging device 100 obtained, the parasitic sensitivity can be reduced.

The operation of the imaging device 100 is not limited to that in the above example. For example, an operation that allows an electronic ND function for adjusting the sensitivity to photoelectric conversion may be performed.

In the exposure period E in FIG. 9, the voltage supply circuit 19 supplies the voltage Va as the voltage V2 to the upper electrodes 6. However, for example, when a voltage corresponding to a predetermined ND value that is determined using the relation between the bias voltage and the current value at this voltage (specifically, the extraction amount of the generated holes or electrons) is supplied instead of the voltage Va, the electronic ND function can be achieved in the imaging device 100.

Figure 10:
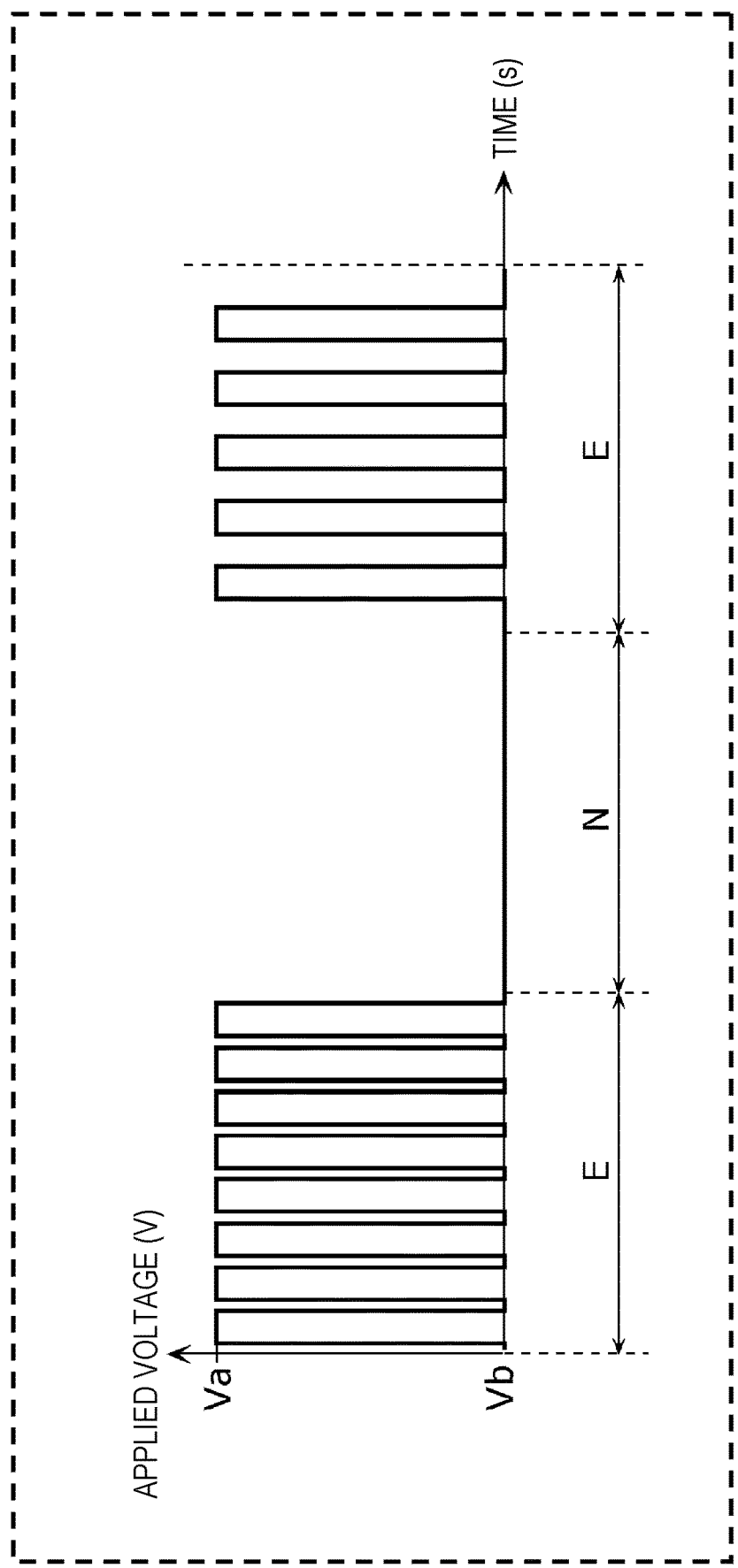
FIG. 10 is a timing chart showing an example of the operation for controlling the sensitivity to photoelectric conversion by a pulse duty control method in the imaging device according to the embodiment.

FIG. 10 is a timing chart showing an example of the operation for adjusting the sensitivity to photoelectric conversion in the imaging device 100 using a pulse duty control method. As shown in FIG. 10, the voltage supply circuit 19 supplies, for example, a pulse-shaped voltage in which the above-described voltages Va and Vb are repeated in the exposure period E. As in this example, first periods in which the voltage Va that is an example of the first voltage is supplied and second periods in which the voltage Vb that is an example of the second voltage is supplied may be included in the exposure period E in one frame. In this case, the duty cycle of the pulse-shaped voltage in which the voltages Va and Vb are repeated is set to a duty cycle corresponding to a predetermined ND value, and then the voltage supply circuit 19 supplies this voltage to the upper electrodes 6. In this manner also, the electronic ND function can be achieved in the imaging device 100.

As described above, even when the imaging device 100 has the electronic ND function, the parasitic sensitivity of the imaging device 100 is reduced, so that the imaging device 100 can capture images with low noise.

EXAMPLES

The photoelectric conversion elements included in the imaging device according to the present disclosure will be described by way of an Example. However, the present disclosure is not at all limited only to the following Example. More specifically, a photoelectric conversion element included in the imaging device according to the embodiment of the present disclosure and a photoelectric conversion element for comparison of characteristics were produced, and a current in a bright state and a current in a dark state were measured to evaluate parasitic sensitivity.

(Production of Photoelectric Conversion Elements)

Photoelectric conversion elements in the Example and Comparative Example were produced.

Example

A substrate with TiN deposited thereon was used as the support substrate. TiN with a work function of 4.7 eV was used for the lower electrode 2, and 9,9'-[1,1'-biphenyl]-4,4'-diylbis[3,6-bis(1,1-dimethyl ethyl)]-9H-carbazole used as the material of the electron blocking layer 3 was deposited on the lower electrode 2 using a vacuum vapor deposition method to form the electron blocking layer 3. The thickness of the electron blocking layer 3 was 50 nm.

Next, a subphthalocyanine serving as the donor organic semiconductor material and C60 fullerene serving as the acceptor organic semiconductor material were used as materials of the photoelectric conversion layer 4 and co-deposited at a weight ratio of 1:9 on the electron blocking layer 3 using a vacuum vapor deposition method to form the photoelectric conversion layer 4. The thickness of the thus-obtained photoelectric conversion layer 4 was about 500 nm. The subphthalocyanine used was a subphthalocyanine containing boron (B) as the central metal and a chloride ion serving as a ligand coordinating to B.

Next, the subphthalocyanine used as the material of the hole blocking layer 5 was vapor-deposited to a film thickness of 10 nm on the photoelectric conversion layer 4 through a metallic shadow mask using a vacuum vapor deposition method to form the hole blocking layer 5.

Figure 11:
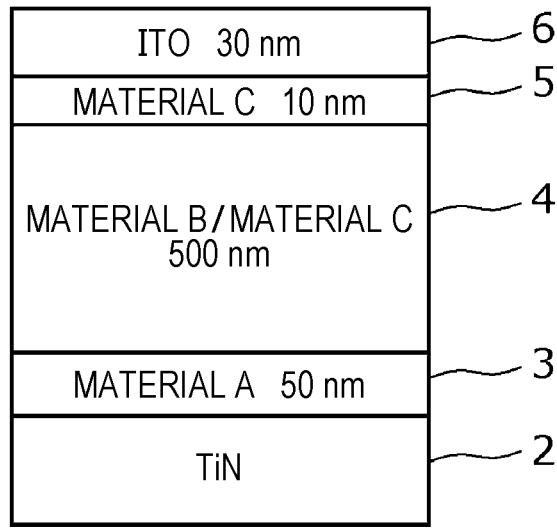
FIG. 11 is an illustration showing a schematic structure of a photoelectric conversion element in an Example.

Next, an ITO film serving as the upper electrode 6 having a thickness of 30 nm was formed on the hole blocking layer 5 using a sputtering method. Then an $Al_2O_3$ film serving as a sealing film was formed on the upper electrode 6 using an atomic layer deposition method to thereby obtain a photoelectric conversion element. The schematic structure of the photoelectric conversion element in the Example is shown in FIG. 11. In FIG. 11, a material A is 9,9'-[1,1'-biphenyl]-4, 4'-diylbis[3,6-bis(1,1-dimethyl ethyl)]-9H-carbazole, a material B is C60 fullerene, and a material C is the subphthalocyanine. The same applies to FIG. 12 described later.

Comparative Example

Figure 12:
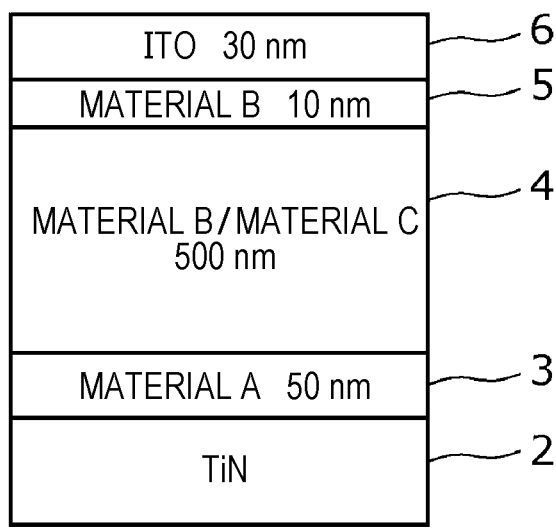
FIG. 12 is an illustration showing a schematic structure of a photoelectric conversion element in a Comparative Example.

A photoelectric conversion element was obtained using the same procedure as in the Example except that C60 fullerene was used instead of the subphthalocyanine as the material of the hole blocking layer 5. The schematic structure of the photoelectric conversion element in the Comparative Example is shown in FIG. 12.

(Measurement of Ionization Potential and Electron Affinity of Materials)

The ionization potential and electron affinity of each of the materials used in the Example and Comparative Example were measured.

In the ionization potential measurement, first, the materials used in the Example were deposited on glass substrates with ITO deposited thereon to prepare samples, and the materials used in the Comparative Example were deposited on glass substrates with ITO deposited thereon to prepare samples. Next, for each of the prepared samples, a photoemission spectrometer in air (AC-3 manufactured by RIKEN KEIKI Co., Ltd.) was used to measure the number of photoelectrons while the energy of ultraviolet radiation was changed, and the energy position at which photoelectrons were first detected was used as the ionization potential.

In the electron affinity measurement, first, the materials used in the Example and the materials used in the Comparative Example were deposited on quartz substrates to prepare samples. Next, for each of the prepared samples, a spectrophotometer (U4100 manufactured by Hitachi High-Tech Corporation) was used to measure an absorption spectrum, and the optical band gap was computed from the results of the determination of the absorption edge of the obtained absorption spectrum. The computed optical bandgap was subtracted from the ionization potential obtained by the ionization potential measurement to estimate the electron affinity.

The ionization potential and electron affinity of each of the materials used in the Example are shown in Table 1. The ionization potential and electron affinity of each of the materials used in the Comparative Example are shown in Table 2.

TABLE 1

| Layer | | Material | Ionization potential (eV) | Electron affinity (eV) |
|---|---|---|---|---|
| Electron blocking layer | | 9,9'-[1,1'-Biphenyl]-4,4'-diylbis[3,6-bis(1,1-dimethyl ethyl)]-9H-carbazole (Material A) | 5.8 | 2.7 |
| Photoelectric conversion layer | Acceptor organic semiconductor material | C60 fullerene (Material B) | 6.2 | 4.2 |
| | Donor organic semiconductor material | Subphthalocyanine (Material C) | 5.5 | 3.4 |
| Hole blocking layer | | Subphthalocyanine (Material C) | 5.5 | 3.4 |

TABLE 2

| Layer | | Material | Ionization potential (eV) | Electron affinity (eV) |
|---|---|---|---|---|
| Electron blocking layer | | 9,9'-[1,1'-Biphenyl]-4,4'-diylbis[3,6-bis(1,1-dimethyl ethyl)]-9H-carbazole (Material A) | 5.8 | 2.7 |
| Photoelectric conversion layer | Acceptor organic semiconductor material | C60 fullerene (Material B) | 6.2 | 4.2 |
| | Donor organic semiconductor material | Subphthalocyanine (Material C) | 5.5 | 3.4 |
| Hole blocking layer | | C60 fullerene (Material B) | 6.2 | 4.2 |

As shown in Table 1, in the photoelectric conversion element in the Example, the ionization potential of the material A forming the electron blocking layer 3 is 5.8 eV, and the ionization potential of the material C that is the donor organic semiconductor material contained in the photoelectric conversion layer 4 is 5.5 eV. Specifically, in the photoelectric conversion element in the Example, the ionization potential of the electron blocking layer 3 is larger than the ionization potential of the donor organic semiconductor material contained in the photoelectric conversion layer 4.

In the photoelectric conversion element in the Example, the electron affinity of the material C forming the hole blocking layer 5 is 3.4 eV, and the electron affinity of the material B that is the acceptor organic semiconductor material contained in the photoelectric conversion layer 4 is 4.2 eV. Specifically, in the photoelectric conversion element in the Example, the electron affinity of the hole blocking layer 5 is smaller than the electron affinity of the acceptor organic semiconductor material contained in the photoelectric conversion layer 4.

In the photoelectric conversion element in the Example, the difference in electron affinity between the acceptor organic semiconductor material contained in the photoelectric conversion layer 4 and the hole blocking layer 5 is 0.8 eV, and the difference in ionization potential between the donor organic semiconductor material contained in the photoelectric conversion layer 4 and the electron blocking layer 3 is 0.3 eV. Specifically, in the photoelectric conversion element in the Example, the difference in electron affinity between the acceptor organic semiconductor material contained in the photoelectric conversion layer 4 and the hole blocking layer 5 is larger than the difference in ionization potential between the donor organic semiconductor material contained in the photoelectric conversion layer 4 and the electron blocking layer 3.

In the photoelectric conversion element in the Example, the material of the hole blocking layer 5 is the same as the donor organic semiconductor material contained in the photoelectric conversion layer 4. However, these materials may be different from each other so long as the above-described magnitude relations among the energies are satisfied.

As shown in Table 2, in the photoelectric conversion element in the Comparative Example, the electron affinity of the material B forming the hole blocking layer 5 is 4.2 eV, and its ionization potential is 6.2 eV. In the photoelectric conversion element in the Comparative Example, the difference in electron affinity between the acceptor organic semiconductor material contained in the photoelectric conversion layer 4 and the hole blocking layer 5 is 0.0 eV, and the difference in ionization potential between the donor organic semiconductor material contained in the photoelectric conversion layer 4 and the electron blocking layer 3 is 0.3 eV. Specifically, in the photoelectric conversion element in the Comparative Example, the difference in electron affinity between the acceptor organic semiconductor material contained in the photoelectric conversion layer 4 and the hole blocking layer 5 is smaller than the difference in ionization potential between the donor organic semiconductor material contained in the photoelectric conversion layer 4 and the electron blocking layer 3.

(Evaluation of Parasitic Sensitivity)

For each of the photoelectric conversion elements in the Example and Comparative Example, the current densities in bright and dark states were measured to evaluate parasitic sensitivity. To measure the current densities, a semiconductor device parameter analyzer (B1500A manufactured by Keysight Technologies) was used. Specifically, the current-voltage characteristics in the bright and dark states were measured while the bias applied between the pair of electrodes of the photoelectric conversion element, i.e., between the upper electrode 6 and the lower electrode 2, was changed.

As for the reverse and forward bias voltages, the reverse bias is a bias when a negative voltage is applied to the lower electrode 2 or a positive voltage is applied to the upper electrode 6, and the forward bias is a bias when a positive voltage is applied to the lower electrode 2 or a negative voltage is applied to the upper electrode 6.

Figure 13:
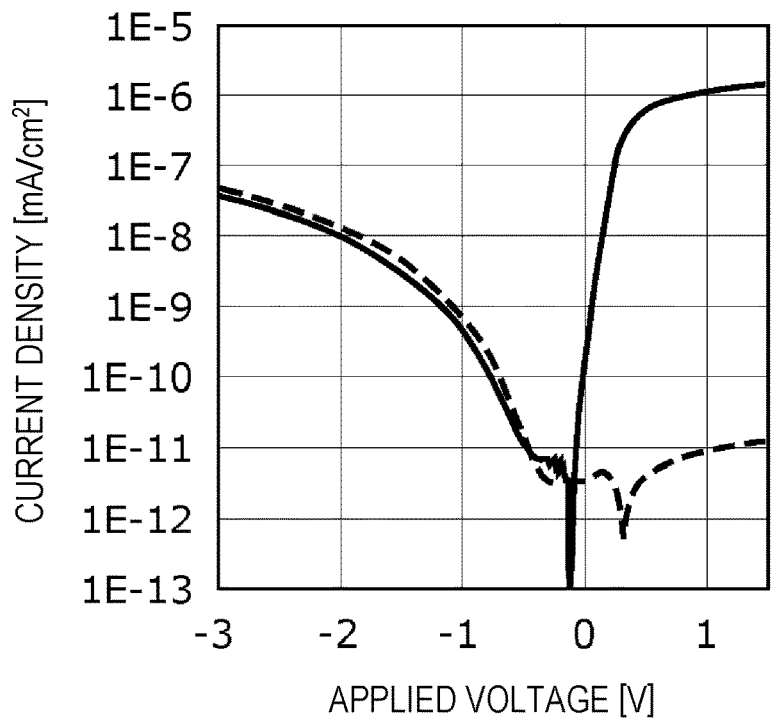
FIG. 13 is a graph showing current densities in bright and dark states when a bias voltage is applied to the photoelectric conversion element in the Example.
Figure 14:
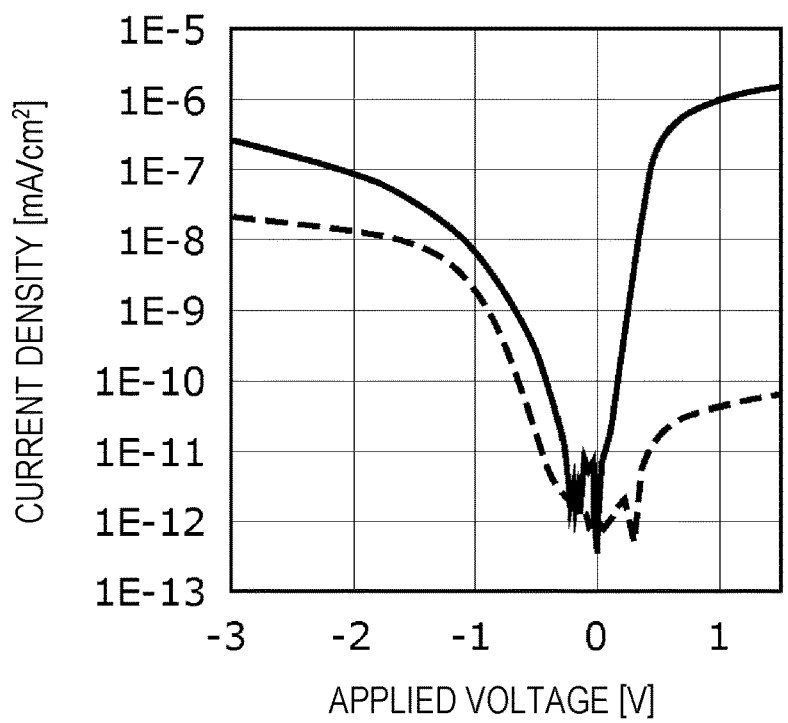
FIG. 14 is a graph showing current densities in bright and dark states when a bias voltage is applied to the photoelectric conversion element in the Comparative Example.

FIG. 13 shows the current densities in the bright and dark states when a bias voltage was applied to the photoelectric conversion element in the Example. FIG. 14 shows the current densities in the bright and dark states when a bias voltage was applied to the photoelectric conversion element in the Comparative Example. In each of FIGS. 13 and 14, a solid graph line represents the I-V characteristics under irradiation with light. In each of FIG. 13 and FIG. 14, a broken graph line represents the I-V characteristics without irradiation with light. In FIG. 13 and FIG. 14, the vertical axis represents the logarithm of the absolute value of the current density, and the horizontal axis represents voltage on an ordinary scale.

As shown in FIG. 14, in the photoelectric conversion element in the Comparative Example, the current densities in the dark and bright states differ from each other except in a very small bias voltage range in the vicinity of 0 V. Therefore, the parasitic sensitivity is large at any voltage set in the non-exposure period, and there are almost no voltages applicable to the non-exposure period. However, in the photoelectric conversion element in the Example, the difference between the current densities in the dark and bright states is almost zero in a wide bias voltage range equal to or less than 0 V as shown in FIG. 13. Therefore, by setting the bias voltage in the non-exposure period within this voltage range, the parasitic sensitivity can be reduced.

As can be seen from the above, in the photoelectric conversion elements included in the imaging device according to the present disclosure, when the difference in electron affinity between the acceptor organic semiconductor material contained in the photoelectric conversion layer 4 and the hole blocking layer 5 is larger than the difference in ionization potential between the donor organic semiconductor material contained in the photoelectric conversion layer 4 and the electron blocking layer 3 as in the photoelectric conversion element in the Example, the difference between the current densities in the bright and dark states can be reduced, and the effect of reducing the parasitic sensitivity can be obtained.

The imaging device according to the present disclosure has been described based on the embodiment and the Example, but the present disclosure is not limited to the embodiment and the Example. Various modifications to the embodiment and Example that are conceivable by a person of skill in the art and modes obtained by combining part of components in the embodiment and Example are also included in the scope of the present disclosure, so long as they do not depart from the spirit of the present disclosure.

The imaging device according to the present disclosure can be applied to, for example, various camera systems and sensor systems such as medical cameras, monitoring cameras, vehicle-mounted cameras, range cameras, microscope cameras, cameras for drones, and cameras for robots.

REFERENCE SIGNS LIST

What is claimed is:
1. An imaging device comprising:
a plurality of pixels, wherein
each of the plurality of pixels includes
   a first electrode,
   a second electrode,
   a photoelectric conversion layer that is located between the first electrode and the second electrode, that contains a donor semiconductor material and an acceptor semiconductor material, and that generates a pair of an electron and a hole,
   a first charge blocking layer located between the first electrode and the photoelectric conversion layer,
   a second charge blocking layer located between the second electrode and the photoelectric conversion layer, and
   a charge storage region that is electrically connected to the second electrode and that stores the hole as a signal charge,
an ionization potential of the second charge blocking layer is equal to or larger than an ionization potential of the donor semiconductor material,
an electron affinity of the first charge blocking layer is smaller than an electron affinity of the acceptor semiconductor material, and
a difference between the electron affinity of the acceptor semiconductor material and the electron affinity of the first charge blocking layer is larger than a difference between the ionization potential of the donor semiconductor material and the ionization potential of the second charge blocking layer.

2. The imaging device according to claim 1, wherein the difference between the electron affinity of the acceptor semiconductor material and the electron affinity of the first charge blocking layer is larger by at least 0.1 eV than the difference between the ionization potential of the donor semiconductor material and the ionization potential of the second charge blocking layer.

3. The imaging device according to claim 1, wherein the first charge blocking layer contains the donor semiconductor material.

4. The imaging device according to claim 1, wherein the difference between the electron affinity of the acceptor semiconductor material and the electron affinity of the first charge blocking layer is equal to or less than 1 eV.

5. The imaging device according to claim 1, further comprising a voltage supply circuit electrically connected to the first electrode and configured to provide a potential difference between the first electrode and the second electrode,
wherein the voltage supply circuit is configured to supply a first voltage to the first electrode in a first period and to supply a second voltage different from the first voltage to the first electrode in a second period.

6. The imaging device according to claim 5, wherein a photoelectric conversion efficiency of the plurality of pixels in the first period differs from a photoelectric conversion efficiency of the plurality of pixels in the second period.

7. The imaging device according to claim 5, wherein
the imaging device is operated in a global shutter mode in which a same timing is applied to an exposure period of each of the plurality of pixels, and
the signal charge is stored in the charge storage region in the exposure period.

8. The imaging device according to claim 7, wherein
the first period is the exposure period, and
the second period is a non-exposure period different from the exposure period.

9. The imaging device according to claim 8, wherein, when the voltage supply circuit is configured to supply the second voltage to the first electrode, the electron and the hole in the photoelectric conversion layer are recombined.

10. The imaging device according to claim 8, wherein, when the voltage supply circuit is configured to supply the first voltage to the first electrode, the photoelectric conversion layer exhibits sensitivity to photoelectric conversion.

11. The imaging device according to claim 6, wherein
the first period and the second period are included in at least one exposure period in one frame, and
in the at least one exposure period, the signal charge is stored in the charge storage region.

12. The imaging device according to claim 1, wherein
the donor semiconductor material is a donor organic semiconductor material, and
the acceptor semiconductor material is an acceptor organic semiconductor material.

13. The imaging device according to claim 1, wherein a thickness of the first charge blocking layer is equal to or more than 5 nm.

14. The imaging device according to claim 1, wherein a thickness of the second charge blocking layer is equal to or more than 5 nm.

15. The imaging device according to claim 1, wherein the first electrode is a transparent electrode.

16. The imaging device according to claim 1, wherein a work function of the first electrode is equal to or larger than a work function of the second electrode.

17. An imaging device comprising:
a plurality of pixels, wherein
each of the plurality of pixels includes
   a first electrode,
   a second electrode,
   a photoelectric conversion layer that is located between the first electrode and the second electrode, that contains a donor semiconductor material and an acceptor semiconductor material, and that generates a pair of an electron and a hole,
   a first charge blocking layer located between the first electrode and the photoelectric conversion layer,
   a second charge blocking layer located between the second electrode and the photoelectric conversion layer, and
   a charge storage region that is electrically connected to the second electrode and that stores the electron as a signal charge,
an electron affinity of the second charge blocking layer is equal to or smaller than an electron affinity of the acceptor semiconductor material,
an ionization potential of the first charge blocking layer is larger than an ionization potential of the donor semiconductor material, and
a difference between the ionization potential of the donor semiconductor material and the ionization potential of the first charge blocking layer is larger than a difference between the electron affinity of the acceptor semiconductor material and the electron affinity of the second charge blocking layer.

* * * * *